(12) United States Patent
Yokoyama et al.

(10) Patent No.: US 7,381,673 B2
(45) Date of Patent: Jun. 3, 2008

(54) COMPOSITE MATERIAL, WAFER HOLDING MEMBER AND METHOD FOR MANUFACTURING THE SAME

(75) Inventors: Kiyoshi Yokoyama, Kokubu (JP); Naoko Itonaga, Kokubu (JP)

(73) Assignee: Kyocera Corporation, Kyoto (JP)

( * ) Notice: Subject to any disclaimer, the term of this patent is extended or adjusted under 35 U.S.C. 154(b) by 272 days.

(21) Appl. No.: 10/974,560

(22) Filed: Oct. 27, 2004

(65) Prior Publication Data

US 2005/0101082 A1 May 12, 2005

(30) Foreign Application Priority Data

Oct. 27, 2003 (JP) .......................... P 2003-366568
Nov. 25, 2003 (JP) .......................... P 2003-394817

(51) Int. Cl.
*C04B 35/00* (2006.01)
*C04B 35/565* (2006.01)
*H01L 21/677* (2006.01)
*B05C 13/00* (2006.01)

(52) U.S. Cl. ...................... 501/154; 501/133; 414/217; 428/627; 428/630; 118/500; 211/41.18; 264/340; 264/682; 279/128

(58) Field of Classification Search .................. 501/53, 501/68, 73, 133, 154; 414/217; 428/627, 428/630, 632, 650, 642; 361/234, 233; 118/500; 211/41.18; 279/128; 264/340, 682

See application file for complete search history.

(56) References Cited

U.S. PATENT DOCUMENTS

| | | | |
|---|---|---|---|
| 5,168,014 A * | 12/1992 | Daimaru et al. ............ | 428/627 |
| 5,539,179 A | 7/1996 | Nozawa et al. | |
| 5,589,116 A | 12/1996 | Kojima et al. | |
| 5,886,863 A | 3/1999 | Nagasaki et al. | |
| 5,983,906 A | 11/1999 | Zhao et al. | |
| 6,189,482 B1 | 2/2001 | Zhao et al. | |
| 6,351,367 B1 | 2/2002 | Mogi et al. | |
| 6,583,980 B1 | 6/2003 | Wang et al. | |
| 6,631,062 B1 | 10/2003 | Minamisawa et al. | |
| 6,884,511 B1 * | 4/2005 | Rossing et al. ............. | 428/446 |
| 2002/0036881 A1 * | 3/2002 | Shamouilian et al. ....... | 361/234 |
| 2002/0050246 A1 | 5/2002 | Parkhe | |

(Continued)

FOREIGN PATENT DOCUMENTS

JP           03-003249           1/1991

(Continued)

OTHER PUBLICATIONS

Korean language office action for corresponding Korean application No. 10-2004-0086219 lists the references above, (May 2007).

(Continued)

*Primary Examiner*—Michael E. Lavilla
(74) *Attorney, Agent, or Firm*—Hogan & Hartson LLP

(57) ABSTRACT

A composite material according to the present invention, is composed of SiC, $SiO_2$, at least one out of Al and Si, with He leak rate of $1.3 \times 10^{-10}$ $Pa \cdot m^3/sec$ or below, thereby providing a composite material, which has a higher vacuum air-tightness, an excellent thermal conductivity, an adjustable coefficient of thermal expansion, small variation in strength and higher reliability, and a method for manufacturing the composite material, and a wafer holding member including the composite material.

14 Claims, 5 Drawing Sheets

U.S. PATENT DOCUMENTS

2002/0150789 A1    10/2002    Hiramatsu et al.

FOREIGN PATENT DOCUMENTS

| JP | 09045757 A | 2/1997 |
|----|------------|--------|
| JP | 10-032239 | 2/1998 |
| JP | 2001253777 A | 9/2001 |
| JP | 2003-037158 | 2/2003 |
| JP | 2003-080375 | 3/2003 |
| JP | 2003-155575 | 5/2003 |
| KR | 1998071011 A | 10/1998 |
| KR | 100220212 A | 6/1999 |
| KR | 19990083652 A | 12/1999 |
| KR | 20000067819 A | 11/2000 |

OTHER PUBLICATIONS

Chinese language office action and its English translation for corresponding Chinese application No. 200410086000.4 lists the references above, (Jun. 2007).

* cited by examiner

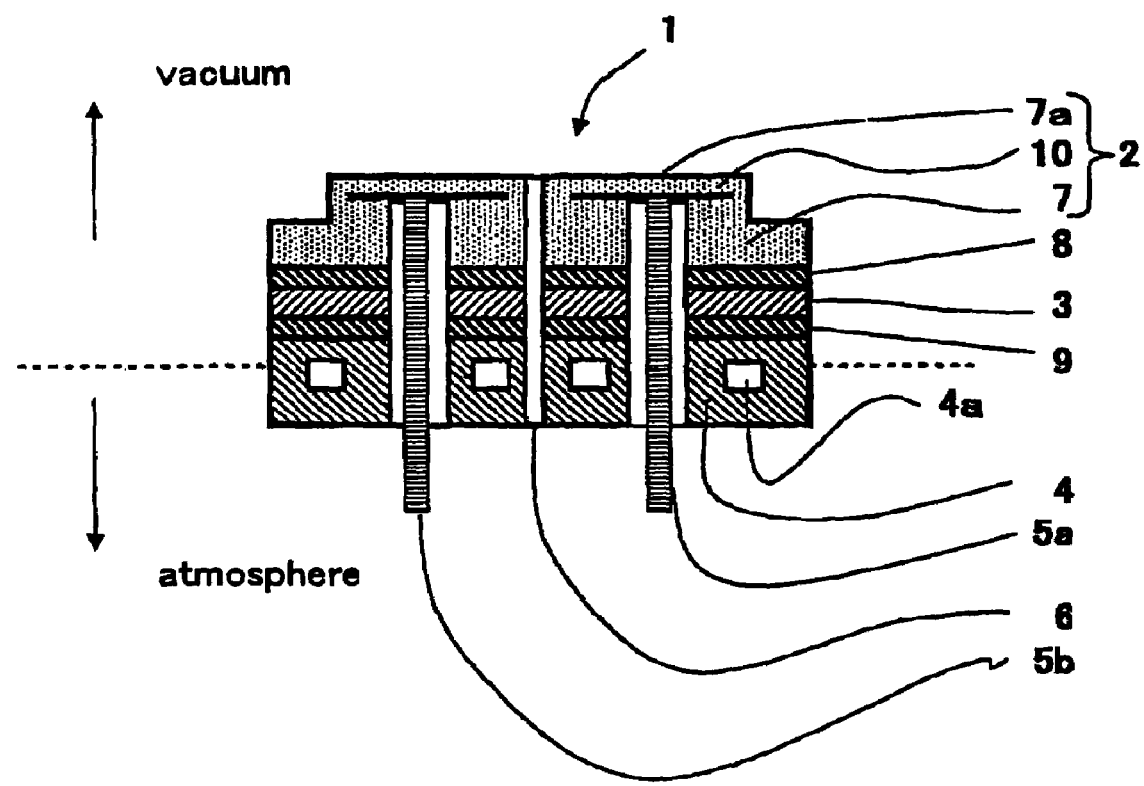

US 7,381,673 B2

COMPOSITE MATERIAL, WAFER HOLDING MEMBER AND METHOD FOR MANUFACTURING THE SAME

This application is based on both an application No. 2003-366568 filed on Oct. 27, 2003 in Japan, and another application No. 2003-394817 filed on Nov. 25, 2003 in Japan, these disclosures of which are incorporated herein by reference.

BACKGROUND OF THE INVENTION

1. Field of the Invention

The present invention relates to a composite material, which is composed of a ceramic component and a metallic component, and a method for manufacturing the composite material and a wafer holding member including the composite material. The present invention also relates to a wafer holding member for holding a wafer, such as semiconductor substrate or a substrate for liquid crystal, either in a deposition process, such as CVD (Chemical Vapor Deposition), PVD (Physical Vapor Deposition), sputtering, SOD (Spin-on Dielectric), SOG (Spin-on Glass), or in an etching process, and a method for manufacturing the wafer holding member.

2. Description of the Related Art

A composite material composed of a metal and a ceramics has characteristics that a coefficient of thermal expansion can be optionally adjusted by changing the ratio of metal to ceramics, with a desired thermal conductivity by selecting metallic species having a higher thermal conductivity and ceramic species. In a heat dissipation substrate for an IGBT (Insulated-Gate Bipolar Transistor) for example, in order to remove heat emitted from an IC chip, which is soldered to a Cu-metalized film on a ceramic substrate, the above-mentioned composite material is joined to the back of the ceramic substrate with metal adhesives or the like so as to function as a heat sink.

In addition, some composite materials are increasingly developed in the field of semiconductor manufacturing apparatus. In a semiconductor wafer process for manufacturing a semiconductor device, e.g., in either a deposition process, such as CVD, PVD, sputtering, or an etching process, it is important to deposit a homogeneous film having a uniform thickness on an objective wafer and to form an etching having a uniform depth on the deposited film. Therefore, a wafer holding member, which can facilitate temperature control of the wafer, is used. For the wafer holding member, for example, an electrostatic chuck includes a plate base, one principal plane of which serves as a placing surface for a wafer; and an internal electrode for attraction, which is provided near the placing surface of the plate base, wherein the wafer is held on the placing surface by generating an electrostatic attracting force between the wafer on the placing surface and the internal electrode.

Further, there is another type of wafer holding member which can heat up the wafer, where another internal electrode for heating is provided in the vicinity of another principal plane of the plate base. Both the internal electrodes for attraction and heating are electrically connected to feeding terminals, respectively. When the wafer is placed on the placing surface and a voltage is applied to the feeding terminals, the electrostatic attracting force is generated between the wafer and the attracting electrode so that the wafer is firmly held on the placing surface. Coincidentally, the wafer can be also heated up to a high temperature.

In yet another type of wafer holding member, the undersurface of which is joined with a metal plate, applying an RF voltage between the plate and an opposite electrode (not shown) can efficiently generate plasma above the wafer.

Recently, for internal wiring in a semiconductor device, conventional aluminum wiring is gradually shifted to copper wiring. In the copper wiring, heating a wafer up to a high temperature is not required. A wafer holding member having an electrostatic attracting function of holding the wafer around a room temperature is needed. The wafer mounted on the placing surface of the wafer holding member is exposed to plasma, including Cu or Ar, with the temperature rising up. In order to suppress the rise in temperature, there is a cooling approach where a plate, which is formed of a composite material having a higher thermal conductivity of 150 W/(m·K) or more, either composed of Al and SiC or composed of Al, Si and SiC, is joined to the wafer holding member with a brazing material or solder, so as to remove heat from the heated wafer subjected to plasma, including Cu or Ar, by water-cooling or air-cooling the plate. Such a plate, formed of a composite material, joined to the wafer holding member as used under the condition as described above requires the thermal conductivity of 160 W/(m·K) or more, the coefficient of thermal expansion close to that of the ceramics used in the wafer holding member, and the He leak rate of $1.3 \times 10^{-10}$ Pa·m$^3$/sec or below.

The prior document 1 (Japanese Patent Unexamined Publication (kokai) JP-A-10-32239 (1998)) proposes an electrostatic chuck, as shown in FIG. 4, including a plate base 24 of ceramics, in which an electrode 20 for electrostatically attraction is embedded, and a plate 23 composed of ceramics and Al, which is joined to the plate base 24. SiC is proposed as a ceramic component included in the plate 23. A approach where the plate base 24 and the plate 23 are joined to each other using a brazing material or solder by selecting a joint temperature in a range of 150 to 630 degree-C. corresponding to the ratio of the ceramic component in the plate 23 is also proposed.

The prior document 2 (Japanese Patent Unexamined Publication (kokai) JP-A-15-155575 (2003)) proposes another approach where a plating film is provided on a surface of a composite material composed of aluminum and SiC for joining other objects. Each plate described in the prior document 1 or 2 is composed either of ceramics and Al or of SiC and Al, and basically porous. Because of the difference in coefficient of thermal expansion between the fused metal and the ceramics like SiC, pores are created in cooling process after impregnating a ceramic preform with the fused metal or after casting a mixture of the fused metal and the ceramic into a mold, based on the difference in contraction due to the difference in coefficient of thermal expansion between the metallic species and the ceramic species.

The prior document 3 (Japanese Patent Unexamined Publication (kokai) JP-A-3-3249 (1991)) proposes yet another approach where a water-cooled electrode formed of Al and an electrostatic chuck formed of ceramics are joined to each other on a joint plane having a plating of In film at a temperature of 170 degree-C. or below.

The prior document 4 (Japanese Patent Unexamined Publication (kokai) JP-A-2003-37158) proposes an electrostatic chuck, as shown in FIG. 5, including a base 34, an insulating layer 36 formed on the base 34, an electrode 37 provided thereon, and a dielectric layer 38 provided for covering the electrode, characterized in that a metal layer 35 is formed on the surface of the base 34, and the base 34 is formed of a metal-ceramic composite material compounded of metal and ceramic powder, and the dielectric layer 38 has a volume resistibility value of $1\times10^8$ to $5\times10^{13}$ ohm·cm.

The prior document 5 (Japanese Patent Unexamined Publication (kokai) JP-A-2003-80375) proposes a wafer holding member in which a metal member and a ceramic member are joined to each other via a metal layer.

However, since the above-mentioned composite plate, composed either of two components of Al and SiC or of Al, Si and SiC, is porous itself, when the plate base serving as a wafer holding member and the plate are joined to each other using a brazing material or solder, it cannot maintain vacuum gas-tightness of $1.3\times10^{-10}$ Pa·m³/sec or below in terms of He leak rate, which is required for a semiconductor manufacturing apparatus.

The wafer holding member used for a leading-edge semiconductor manufacturing process requires the He leak rate of $1.3\times10^{-10}$ Pa·m³/sec or below, the Weibull modulus, indicating variation in strength of the material, of 5 or more, the thermal conductivity of 160 W/(m·K) or more, and the coefficient of thermal expansion of $4\times10^{-6}$ to $6\times10^{-6}$/degree-C., close to that of the ceramics. The conventional composite material cannot simultaneously satisfy all the factors of He leak rate, variation in strength, thermal conductivity and coefficient of thermal expansion.

Further, a higher thermal conductivity is needed for removing efficiently heat of the Si-wafer heated by plasma. A wafer holding member, in which a plate base and a plate of Al are joined to each other using Al-brazing or In-brazing in order to increase the thermal conductivity, has a problem that the plate base is cracked under a thermal shock cycle of –40 to 100 degree-C., which is required for a deposition apparatus, such as CVD, PVD and sputtering, or an etching apparatus, because of the large difference in coefficient of thermal expansion between the plate of Al and the plate base.

Furthermore, when the composite plate, composed of two components of aluminum and SiC, and the ceramic plate are joined to each other using metal, wetting between the aluminum and the metal joint layer is not so good. Even though the composite plate of two components and the ceramic plate are integrated using metal joint, pores are likely to be created in the joint interface because of the bad wetting between the metal joint layer and the aluminum. The resulting pores cannot ensure the reliability under the thermal shock cycle of –40 to 150 degree-C., which is required for a deposition apparatus, such as CVD, PVD, sputtering, SOD or SOG, or an etching apparatus, even using the conventional manufacturing method as proposed in the prior document 1 (JP-A-10-32239) or 4 (JP-A-2003-37158).

Since the deposition apparatus, such as CVD, PVD, sputtering, SOD or SOG, or the etching apparatus employs a process in vacuum, a placing surface 20a of the wafer holding member is exposed to a high vacuum and a composite plate 23 is used in the ambient air.

Then, a coolant gas, such as Ar, is introduced through a gas feeding hole 21. A joint material 22 is generally subject to a kind of thermal shock cycle of –40 to 150 degree-C. Therefore, the reliability of the joint material 22 is required.

In FIG. 4, showing the conventional example, when using for an electrostatic chuck, some gas species is introduced to the back of a Si wafer through the gas feeding hole 21. The joint material 22 requires the vacuum gas-tightness as much as $1.3\times10^{-10}$ Pa·m³/sec in terms of He leak rate. The composite plate is composed of two components of aluminum and SiC. In case metal is used for the joint material, wetting between the aluminum and the metal joint material is bad, resulting in minute pores created between the metal joint material and the aluminum. It is difficult to maintain the reliability under the thermal shock cycle.

Further, after depositing a desired film on the wafer attached onto the placing surface using CVD, PVD, sputtering, SOD or SOG in a vacuum chamber or etching, it is necessary to release the wafer from the placing surface immediately to proceed the next process. But there is a problem on residual attracting force, that a force for attracting the wafer remains because electric charges, which have been accumulated on the placing surface 20a after applying voltage to the electrode 20 for electrostatic attraction to attract the wafer to the placing surface 24a and then turning off the applied voltage to release the wafer on completion of a deposition or etching process, is not neutralized immediately. While the residual attracting force emerges, there are some problems that the wafer cannot be released even in an effort to put the wafer off the placing surface 20a, positioning of the wafer is out of order if released, or at its worst, the wafer is broken when the wafer is forced to be released form the placing surface.

Furthermore, there is a possibility that the residual attracting force emerges after repeating about 10,000 times a step for applying voltage to the electrode for electrostatic attraction through feeding terminals to attract the wafer W by generating an electrostatic attracting force, a step for depositing or etching on the wafer W in a vacuum chamber, and a step for turning off the voltage applied to the feeding terminals to release the wafer W on completion of depositing or etching.

SUMMARY OF THE INVENTION

An object of the present invention is to provide a composite material, which has a higher vacuum gas-tightness, an excellent thermal conductivity, an adjustable coefficient of thermal expansion, small variation in strength and higher reliability, and a method for manufacturing the composite material, and a wafer holding member including the composite material.

Another object of the present invention is to provide a wafer holding member, which has higher durability and higher reliability under a severe thermal shock cycle test, and a smaller residual attracting force and longer duration, and a method for manufacturing the wafer holding member.

A composite material according to the present invention, is composed of SiC, $SiO_2$, at least one out of Al and Si, with He leak rate of $1.3\times10^{-10}$ Pa·m³/sec or below.

In the present invention, it is preferable that the composite material contains 69 to 79 mass % of SiC, 10.6 to 20.6 mass % of Al, 5.4 to 15.4 mass % of Si, and 0.01 to 5 mass % of $SiO_2$.

In the present invention, it is preferable that the composite material contains 71.5 to 76.5 mass % of SiC, 13.1 to 18.1 mass % of Al, 7.9 to 12.9 mass % of Si, and 0.05 to 2 mass % of $SiO_2$.

A wafer holding member according to the present invention, includes: a wafer holding portion having a plate base, one principal plane of which serves as a placing surface for mounting a wafer, and an electrode provided either on the other principal plane or inside of the plate base; and a plate formed of the above-mentioned composite material;

wherein the coefficient of thermal expansion of the plate is 0.8 to 1.2 times as large as the coefficient of thermal expansion of the plate base, and the plate base and the plate are joined to each other using a metal joint material.

In the present invention, it is preferable that the metal joint material contains 6 to 15 mass % of Si, 0.1 to 5 mass % of Mg or Cu, and the remaining part including a main component of Al and an additive component of 0.01 to 10 mass % of at least one selected out of Ni, Au and Ag.

A method for manufacturing the composite material according to the present invention, includes: a step for impregnating a material composed of SiC and at least one out of Al and Si with alkyl silicate; and a subsequent step for drying the material, thereby obtaining the above-mentioned composite material.

Further, a wafer holding member according to the present invention, includes: a wafer holding portion having a plate ceramic body, one principal plane of which serves as a placing surface for mounting a wafer, and an electrode provided either on the other principal plane or inside of the plate ceramic body;

a composite plate containing SiC, aluminum and silicon;

a first metal layer provided on a face opposite to the placing surface of the wafer holding portion; and a second metal layer provided on a face of the composite plate;

wherein the wafer holding portion and the composite plate are joined to each other via a metal joint material between the first and second metal layers, and a ratio of the thickness tm of the second metal layer to the thickness t of the metal joint material is in a range of 0.01 to 1.

In the present invention, it is preferable that the second metal layer has a main component of one or two or more selected out of aluminum, gold, silver, copper and nickel.

In the present invention, it is preferable that the metal joint material is a brazing material having a main component of aluminum or indium.

In the present invention, it is preferable that the electrode is an electrode for electrostatic attraction.

Further, a wafer holding member according to the present invention, includes: a plate ceramic body one principal plane of which serves as a placing surface for mounting a wafer; and an electrode provided either on the other principal plane or inside of the plate ceramic body;

wherein a volume resistivity of the plate ceramic body is in a range of $10^8$ to $10^{11}$ ohm·cm, and a conductive layer is provided a face opposite to the placing surface, and an area of the conductive layer is 100% or more of an area of the placing surface.

In the present invention, it is preferable that the area of the conductive layer is 115% or more of the area of the placing surface.

In the present invention, it is preferable that a thickness of the plate ceramic body is 15 mm or below.

In the present invention, it is preferable that the wafer holding member further includes: a through-hole passing through the plate ceramic body; and a groove communicating with the through-hole, provided on the placing surface, wherein a depth of the groove is in a range of 10 to 500 µm.

In the present invention, it is preferable that the groove includes a radial groove radially extending from the center toward the circumference of the plate ceramic body.

In the present invention, it is preferable that a length of the radial groove is one-third or more of the radius of the plate ceramic body.

A method for manufacturing the wafer holding member according to the present invention, includes: a step for forming metal layers both on the face opposite to the placing surface of the wafer holing portion and on the face of the composite plate;

a step for providing a brazing material between the first and second metal layers; and a step for joining the wafer holing portion and the composite plate to each other by pressing and heating the brazing material, thereby obtaining the above-mentioned wafer holding member.

According to the present invention, stringent selection of composition in the composite material allows the vacuum gas-tightness of $1.3\times10^{-10}$ Pa·m³/sec or below in terms of He leak rate, even in case the composite material is joined to the plate base.

Further, because the composite material can have a Weibull modulus of 5 or more, a thermal conductivity of 160 W/(m·K) or more, and a coefficient of thermal expansion of $4\times10^{-6}$ to $6\times10^{-6}$/degree-C., the plate base is not cracked under a thermal shock cycle of −40 to 100 degree-C., which is required for a deposition apparatus, such as CVD, PVD and sputtering, or an etching apparatus, and heat of the wafer can dissipate efficiently through the wafer holding member to outside. Additionally, smaller variation in strength of the composite material allows the wafer holding member with higher reliability.

Moreover, according to the present invention, even in case the composite material having a porosity of 5 to 50% is joined to the ceramic electrostatic chuck, the wafer holding member which can with stand a thermal shock cycle test of −40 to 150 degree-C. for 10,000 cycles or over is realized with higher reliability.

Further, a smaller residual attracting force facilitates the wafer to be released quickly, even after repetition of attraction and release. The wafer holding member, in which the residual attraction does not emerge after 100,000 times or over of repetition of attraction and release, is realized.

BRIEF DESCRIPTION OF THE DRAWINGS

FIG. 2 is a sectional view showing the second embodiment of the present invention.

DETAILED DESCRIPTION OF THE PREFERRED EMBODIMENTS

Hereinafter, preferred embodiments will be described with reference to drawings.

Embodiment 1

Figure 1A:
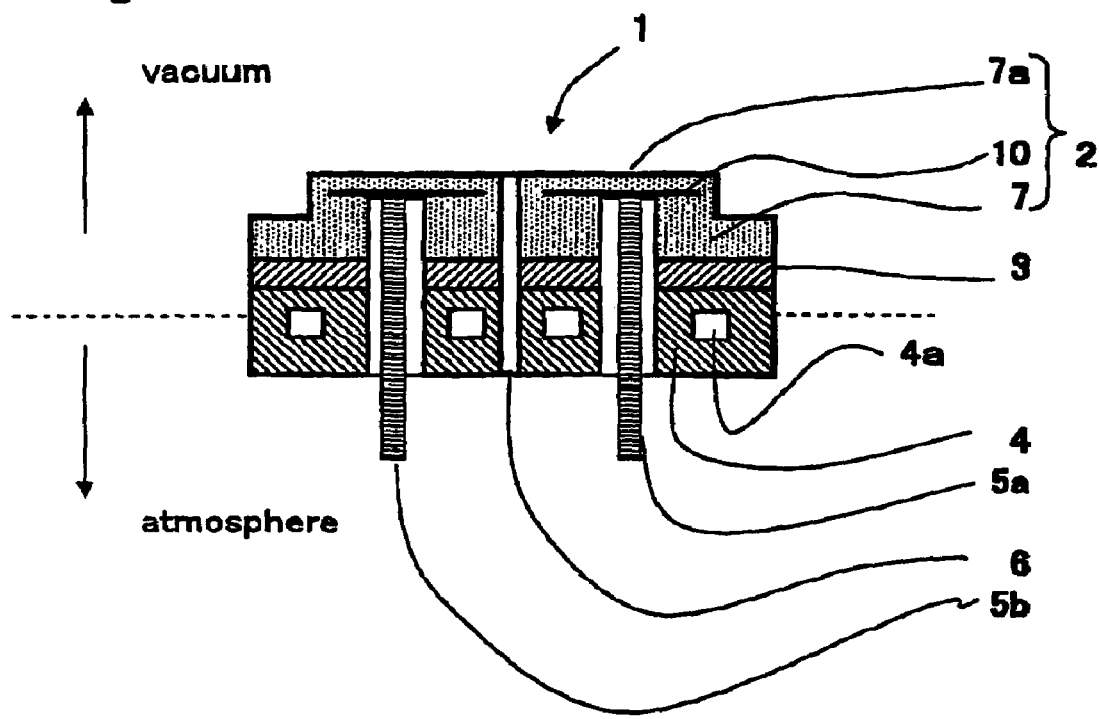
FIG. 1A is a sectional view showing the first embodiment of the present invention.
Figure 1B:
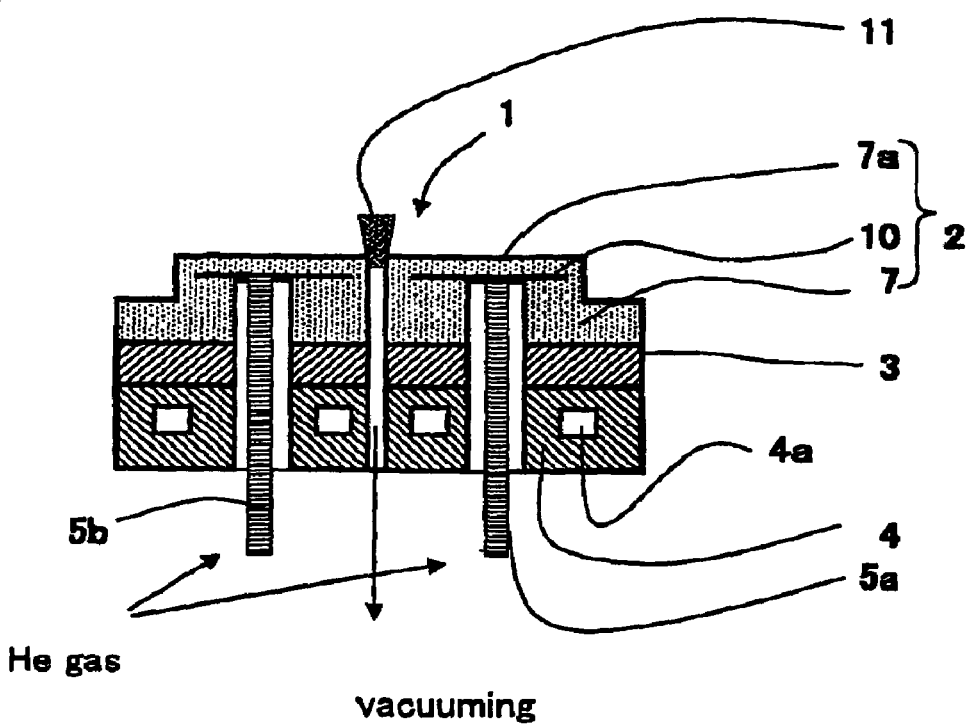
FIG. 1B is a explanatory view showing a measurement method of a leak rate.

FIG. 1A is a sectional view showing the first embodiment of the present invention. FIG. 1B is a explanatory view showing a measurement method of a leak rate.

A wafer holding member 1 includes a wafer holding portion 2 having a plate base 7, one principal plane of which serves as a placing surface 7a for mounting a wafer, and electrodes 10 provided either on the other principal plane or inside of the plate base 7; and a plate 4 composed of SiC, SiO$_2$, and at least one out of Al and Si, wherein the wafer holding portion 2 and the plate 4 are joined to each other via a metal joint material 3 on a face opposite to the placing surface 7a of the wafer holding portion 2.

The plate base 7 is preferably formed of oxide ceramics, such as alumina, nitride ceramics, carbide ceramics. On the placing surface 7a, provided is a groove (not shown). When an argon gas of the like is supplied through a gas feeding hole 6 passing through the wafer holding portion 2, a space between a wafer W and the groove is filled with the gas so as to increase the thermal conductivity between the wafer W and the placing surface 7a, thereby dissipating heat of the wafer W.

Further, the plate 4 is formed of a composite material of metal and ceramics. This structure enables the coefficients of thermal expansion of both the plate base 7 and the plate 4 to make close to each other, and the thermal conductivity of the plate 4 to increase up to about 160 W/(m·K), preferably, thereby easily removing heat, which is transferred from an atmosphere, like plasma, to the wafer W, through the plate 4.

In the plate 4, provided is a passage 4a for running a coolant through to remove the heat of the wafer W to outside by means of the coolant, thereby easily controlling the temperature of the wafer W with the temperature of the coolant.

When applying several hundreds volts of attraction voltage between the attraction electrodes 10 via feeding terminals 5a and 5b with the wafer W mounted on the placing surface 7a, an electrostatic attracting force emerges between the attraction electrodes 10 and the wafer W to attract the wafer W toward the placing surface 7a. In addition, in case applying an RF voltage between the plate 4 and a counter electrode (not shown), plasma can be generated effectively above the wafer W.

The composite material according to the present invention can be used for the above-mentioned plate 4 by producing a fusion solidified body using such steps as forming a desired shape of a ceramic porous preform, and then impregnating the preform with fused Al or Si or an alloy of Al and Si in atmosphere of a non-oxidizing gas. Such a fusion solidified body can be also produced by stirring and dispersing ceramics into fused Al or Si or an alloy of Al and Si, and then casting the uniformly dispersed mixture of ceramics and metal into a desired shape of mold. Then, by impregnating the fusion solidified body with alkyl silicate, such as methyl silicate or ethyl silicate to fill pores of the body, and then drying it to retain SiO$_2$ inside the body, pores of the fusion solidified body is sealed, resulting in the composite material.

The composite material according to the present invention is composed of SiC, SiO$_2$, at least one out of Al and Si, with He leak rate of $1.3 \times 10^{-10}$ Pa·m$^3$/sec or below. If the He leak rate exceeds $1.3 \times 10^{-10}$ Pa·m$^3$/sec, it is impossible to use the composite material as a plate of the wafer holding member in a high-purity process for forming an ultrafine pattern of 0.13 μm or below on a semiconductor device.

Incidentally, the conventional composite material described in the prior documents 1 and 2 is composed either of ceramics and Al, or of SiC and Al. This composite material is basically porous so as to allow leakage of helium and quite different from the present invention.

As to the composite material according to the present invention, it is found out that it is effective for suppressing the He leak rate to impregnate the fusion solidified body, which is composed of SiC, SiO$_2$, at least one out of Al and Si, with alkyl silicate, such as methyl silicate or ethyl silicate to fill pores of the body, and then dry it to retain SiO$_2$ inside the body so that pores of the fusion solidified body is sealed. Since the composite material is composed of SiC, SiO$_2$, at least one out of Al and Si, SiO$_2$ can be embedded in porous portions of the fusion solidified body, thereby suppressing the He leak rate.

Further, the composite material according to the present invention preferably contains 69 to 79 mass % of SiC. If the composite material contains less than 69 mass % of SiC, variation of strength becomes larger and the Weibull modulus also becomes smaller than 5. Therefore, in case the composite material is used for the plate 4 of the wafer holding member, the plate 4 is likely to be cracked under such a thermal shock cycle of −40 to 100 degree-C. as in a practical process during or after joining the plate 4 and the plate base 7. Meanwhile, if the composite material contains more than 79 mass % of SiC, the porous portions exist in the fusion solidified body but radii of the porous portions become smaller, thereinto SiO$_2$ is hardly impregnated. Consequently, the composite material still stays porous, thereby hardly attaining the He leak rate of less than $8.0 \times 10^{-11}$ Pa·m$^3$/sec.

Further, the composite material according to the present invention preferably contains 10.6 to 20.6 mass % of Al, because if the composite material contains less than 10.6 mass % of Al, the thermal conductivity of the composite material becomes smaller than 160 W/(m·K), so that the heat from the plate base 7, which is heated up by the Si wafer exposed in plasma of Ar or Cu, is barely transferred to the coolant even when the plate 4 formed of this composite material is cooled by the coolant. Then the Si wafer is heated up over a desired temperature, which may degrade the yield of an IC chip. Meanwhile, if the composite material contains more than 20.6 mass % of Al, the coefficient of thermal expansion of the composite material becomes larger than $6 \times 10^{-6}$/degree-C. with the difference in thermal expansion between the plate 4 formed of the composite material and the plate base 7 enlarged. Consequently, the plate base 7 may be cracked under a thermal shock cycle of −40 to 100 degree-C., which is required for the wafer holding member 1 in a semiconductor manufacturing apparatus.

Furthermore, the composite material according to the present invention preferably contains 5.4 to 15.4 mass % of Si, because if the composite material contains less than 5.4 mass % of Si, the coefficient of thermal expansion of the composite material becomes larger than $6 \times 10^{-6}$/degree-C. with the difference in thermal expansion between the plate 4 formed of the composite material and the plate base 7 enlarged. Consequently, the plate base 7 may be cracked under a thermal shock cycle of −40 to 100 degree-C., which is required for the wafer holding member 1 in a semiconductor manufacturing apparatus. Meanwhile, if the composite material contains more than 15.4 mass % of Si, the thermal conductivity of the composite material becomes smaller than 160 W/(m·K), so that the heat from the plate base 7, which is heated up by the Si wafer exposed in plasma of Ar or Cu, is barely transferred to the coolant even when the plate 4 formed of this composite material is cooled by the coolant. Then the Si wafer is heated up over a desired temperature, which may degrade the yield of an IC chip.

Moreover, the composite material according to the present invention preferably contains 0.01 to 5 mass % of SiO$_2$, because if the composite material contains less than 0.01 mass % of SiO$_2$, the porous portions of the fusion solidified body are insufficiently embedded because of too less quantity of SiO$_2$, thereby hardly attaining the He leak rate of less than $8.0 \times 10^{-11}$ Pa·m$^3$/sec. Meanwhile, if the composite material contains more than 5 mass % of SiO$_2$, brittleness of SiO$_2$ emerges in the composite material to act as a source of destruction, and variation in strength of the composite material becomes larger and the Weibull modulus also becomes less than 5. In addition, the coefficient of thermal expansion of the composite material becomes smaller than 4×10$^{-6}$/degree-C. with the difference in thermal expansion between the plate 4 formed of the composite material and the plate base 7 enlarged. Consequently, the plate base 7 may be cracked under a thermal shock cycle of −40 to 100 degree-C., which is required for the wafer holding member 1 in a semiconductor manufacturing apparatus.

Accordingly, when the composite material contains 69 to 79 mass % of SiC, 10.6 to 20.6 mass % of Al, 5.4 to 15.4 mass % of Si, and 0.01 to 5 mass % of SiO$_2$, the composite material can attain the He leak rate of 8.0×10$^{-11}$ Pa·m$^3$/sec, the Weibull modulus of 5 or more, the thermal conductivity of 160 W/(m·K) or more, and the coefficient of thermal expansion of 4×10$^{-6}$ to 6×10$^{-6}$/degree-C.

More preferably, the composite material according to the present invention contains 71.5 to 76.5 mass % of SiC.

If the composite material contains less than 71.5 mass % of SiC, variation in strength of the composite material becomes large and the Weibull modulus also becomes smaller than 8. Therefore, the plate 4 is likely to be cracked under such a thermal shock cycle of −40 to 200 degree-C. as in a practical process during or after joining the plate 4 and the plate base 7. Meanwhile, if the composite material contains more than 76.5 mass % of SiC, the porous portions exist in the fusion solidified body but radii of the porous portions become small, thereinto SiO$_2$ is hardly impregnated. Consequently, the composite material still stays porous, thereby hardly attaining the He leak rate of less than 3.0×10$^{-11}$ Pa·m$^3$/sec.

Further, the composite material according to the present invention more preferably contains 13.1 to 18.1 mass % of Al, because if the composite material contains less than 13.1 mass % of Al, the thermal conductivity of the composite material becomes smaller than 200 W/(m·K), so that the heat from the plate base 7, which is heated up by the Si wafer exposed in plasma of Ar or Cu, is barely transferred to the coolant even when the plate 4 formed of this composite material is cooled by the coolant. Then the Si wafer is heated up over a desired temperature, which may degrade the yield of an IC chip. Meanwhile, if the composite material contains more than 18.1 mass % of Al, the coefficient of thermal expansion of the composite material becomes larger than 5.5×10$^{-6}$/degree-C. with the difference in thermal expansion between the plate 4 formed of the composite material and the plate base 7 enlarged. Consequently, the plate base 7 may be cracked under a thermal shock cycle of −40 to 200 degree-C., which is required for the wafer holding member 1 in a semiconductor manufacturing apparatus.

Furthermore, the composite material according to the present invention more preferably contains 7.9 to 12.9 mass % of Si, because if the composite material contains less than 7.9 mass % of Si, the coefficient of thermal expansion of the composite material becomes larger than 5.5×10$^{-6}$/degree-C. with the difference in thermal expansion between the plate 4 formed of the composite material and the plate base 7 enlarged. Consequently, the plate base 7 may be cracked under a thermal shock cycle of −40 to 200 degree-C., which is required for the wafer holding member 1 in a semiconductor manufacturing apparatus. Meanwhile, if the composite material contains more than 12.9 mass % of Si, the thermal conductivity of the composite material becomes smaller than 200 W/(m·K), so that the heat from the plate base 7, which is heated up by the Si wafer exposed in plasma of Ar or Cu, is barely transferred to the coolant even when the plate 4 formed of this composite material is cooled by the coolant. Then the Si wafer is heated up over a desired temperature, which may degrade the yield of an IC chip.

Moreover, the composite material according to the present invention preferably contains 0.05 to 2 mass % of SiO$_2$, because if the composite material contains less than 0.05 mass % of SiO$_2$, the porous portions of the fusion solidified body are insufficiently embedded because of too less quantity of SiO$_2$, thereby hardly attaining the He leak rate of less than 3.0×10$^{-11}$ Pa·m$^3$/sec. Meanwhile, if the composite material contains more than 2 mass % of SiO$_2$, brittleness of SiO$_2$ emerges in the composite material to act as a source of destruction, and variation in strength of the composite material becomes larger and the Weibull modulus also does not become more than 8. In addition, the coefficient of thermal expansion of the composite material becomes smaller than 4.5×10$^{-6}$/degree-C. with the difference in thermal expansion between the plate 4 formed of the composite material and the plate base 7 enlarged. Consequently, the plate base 7 may be cracked under a thermal shock cycle of −40 to 200 degree-C., which is required for the wafer holding member 1 in a semiconductor manufacturing apparatus.

Accordingly, when the composite material contains 71.5 to 76.5 mass % of SiC, 13.1 to 18.1 mass % of Al, 7.9 to 12.9 mass % of Si, and 0.05 to 2 mass % of SiO$_2$, the composite material can attain the He leak rate of 3.0×10$^{-11}$ Pa·m$^3$/sec, the Weibull modulus of 8 or more, the thermal conductivity of 200 W/(m·K) or more, and the coefficient of thermal expansion of 4.5×10$^{-6}$ to 5.5×10$^{-6}$/degree-C., resulting in the more preferable composite material.

The wafer holding member 1 according to the present invention, includes the wafer holding portion 2 having the plate base 7, one principal plane of which serves as the placing surface for mounting the wafer, and the electrodes provided either on the other principal plane or inside of the plate base 7, and the plate 4 formed of the above-mentioned composite material, wherein the coefficient of thermal expansion of the plate 4 is 0.8 to 1.2 times as large as the coefficient of thermal expansion of the plate base 7, and the plate base 7 and the plate 4 are joined to each other using a metal joint material.

If the coefficient of thermal expansion of the plate base 7 is 0.8 times or below as large as the coefficient of thermal expansion of the plate 4, the difference in thermal expansion between the plate base 7 and the plate 4 is enlarged and the plate base 7 may be cracked. Meanwhile, If the coefficient of thermal expansion of the plate base 7 exceeds 1.2 times as large as the coefficient of thermal expansion of the plate 4, the difference in thermal expansion between the plate base 7 and the plate 4 is enlarged and the plate base 7 also may be cracked.

Further, the metal joint material 3 in the wafer holding member 1 according to the present invention preferably contains 6 to 15 mass % of Si, 0.1 to 5 mass % of Mg or Cu, and the remaining part including a main component of Al and an additive component of 0.01 to 10 mass % of at least one selected out of Ni, Au and Ag.

The metal joint material according to the present invention preferably has a higher thermal conductivity and the pores of the plate 4 is preferably sealed with SiO$_2$. It is not preferable that joint at so higher temperature causes SiO$_2$ for sealing the pores to be cracked. It is necessary that the metal joint material can join the plate base 7 and the plate 4 formed of the composite material at 600 degree-C. or below and has such a low vapor pressure not to contaminate the inside of a semiconductor manufacturing apparatus. Accordingly, a type of metal joint material having a joint temperature of nearly 800 degree-C., like Ag brazing material, cannot be used despite of the high thermal conductivity. Another type of metal joint material having a higher vapor pressure, such as solder including Zn, Sn, Cd or Pb, or aluminum solder, also cannot be used despite of the joint temperature of 600 degree-C. or below, since this joint material may contaminate the inside of a semiconductor manufacturing apparatus. However, the metal joint material according to the present invention can have the joint temperature of 600 degree-C. or below, and such a low vapor pressure not to contaminate the inside of a semiconductor manufacturing apparatus, and a higher thermal conductivity, resulting in a more suitable joint material for usage in a semiconductor manufacturing apparatus.

Therefore, it is important that the metal joint material 3 contains 6 to 15 mass % of Si, 0.1 to 5 mass % of Mg or Cu, and the remaining part including a main component of Al and an additive component of 0.01 to 10 mass % of at least one selected out of Ni, Au and Ag.

If the metal joint material 3 does not contain more than 6 mass % of Si, the brazing temperature is not less than 600 degree-C. Meanwhile, if the metal joint material 3 contains more than 15 mass % of Si, the brazing temperature unsuitably exceeds 600 degree-C. In case the metal joint material 3 contains less than 6 mass % or more than 16 mass % of Si, the brazing material becomes brittle, which is easily cracked under a thermal shock cycle, resulting in a larger He leak rate.

Further, addition of 0.1 to 5 mass % of either Mg or Cu allows viscosity during Al-brazing to be lowered and wetting between the Al-brazing layer and the plate base 7 or the plate 4 to be improved, resulting in the more enhanced joint effectively. Since Al and Si are metal, in case of joint at a temperature of nearly 600 degree-C., the viscosity of Al brazing material is increased because the surface of the brazing material is oxidized by a slight oxygen atmosphere existing in a brazing chamber. Addition of at least one out of Mg and Cu can prevent Al and Si from being oxidized during brazing due to coupling with oxygen existing in a brazing chamber. Accordingly, the viscosity of Al brazing material is maintained at a inherent viscosity so as to improve the wetting between the Al-brazing layer and the plate base 7 or the plate 4. In case the metal joint material contains less than 0.1 mass % of either Mg or Cu, it cannot prevent Al and Si from being oxidized, causing a joined portion and a un-joined portion in the joint layer and cracking under a thermal shock cycle. Meanwhile, if the metal joint material contains more than 5 mass % of either Mg or Cu, the brazing material becomes brittle, also causing cracking under a thermal shock cycle unsuitably.

The metal joint material 3 according to the present invention preferably contains a main component as well as an additive component of 0.01 to 10 mass % of at least one selected out of Ni, Au and Ag. Each joint face of the plate base 7 and plate 4 is provided with a metal layer using plating or the like to improve wetting between the metal joint material 3 and the plate base 7 or the plate 4, and then the plate base 7 and the plate 4 are joined to each other by the metal joint material 3. After joining, the metal layer of Ni, Au or Ag is always dispersed in the metal joint material 3. Specifically, before joining, there are three layers of the metal layer on the plate base 7, the brazing material for metal joint and the other metal layer on the composite plate 4. After joining, it is found out that the metal joint material 3 contains 6 to 15 mass % of Si, 0.1 to 5 mass % of Mg or Cu, and the remaining part including a main component of Al and an additive component of 0.01 to 10 mass % of at least one selected out of Ni, Au and Ag. This metal component of Ni, Au or Ag is imagined not only to improve the wetting of the metal joint material 3 during joining but also to strengthen the joint between the metal joint material 3 and the plate base 7 or the plate 4 due to an anchor effect as well as a mutual diffusion by the metal component diffusing in the metal joint material by the end of joining.

If the metal joint material 3 contains a main component as well as an additive component of less than 0.01 mass % of at least one selected out of Ni, Au and Ag, the diffusing quantity in the metal joint material 3 is so small as not to obtain a firm joint between the metal joint material 3 and the plate base 7 or the plate 4, unsuitably causing cracking under a thermal shock cycle test of −40 to 200 degree-C. Meanwhile, if the metal joint material 3 contains a main component as well as an additive component of more than 10 mass % of at least one selected out of Ni, Au and Ag, the brazing material becomes brittle, unsuitably also causing cracking under the thermal shock cycle test.

Therefore, the metal joint material 3 contains 6 to 15 mass % of Si, 0.1 to 5 mass % of Mg or Cu, and the remaining part including a main component of Al and an additive component of 0.01 to 10 mass % of at least one selected out of Ni, Au and Ag, resulting in the wafer holding member 1 which is not cracked under the thermal shock cycle test of −40 to 200 degree-C.

For a method for manufacturing the plate 4 according to the present invention, one method for forming a fusion solidified body includes a step of casting fused Al or Si, in which SiC may be dispersed, into a desired shape of mold, and another method for forming a fusion solidified body includes steps of producing a porous sintered body of SiC and then impregnating it with a fused metal component. After forming the fusion solidified body either of SiC and Al or Si, or Al, Si and SiC, the fusion solidified body is preferably impregnated with alkyl silicate, such as methyl silicate or ethyl silicate, and then dried to retain $SiO_2$ inside the plate.

The above-mentioned manufacturing method allows the He leak rate of $3.0 \times 10^{-11}$ Pa·m$^3$/sec, which is required for a semiconductor manufacturing apparatus. Even if all the pores cannot be sealed by the onetime sealing process, the multiple sealing process can be performed, e.g. two or three times. Repetition of the sealing process using alkyl silicate allows a desired value of the He leak rate of the composite material.

Incidentally, the He leak rate is measured by steps of producing a composite material, followed by finishing the surface of the composite material up to a roughness of Ra 0.1 to 0.2 μm using diamond powder of 5 μm, followed by attaching the surface of the composite material with a metal pipe integrated with an O-ring having an internal diameter of 30 mm and an external diameter of 34 mm, followed by vacuuming the inside room of the pipe, followed by putting the vacuumed pipe in a vinyl bag or a desired shape of casing, which is filled with a He gas. The He gas can be introduced into the inside room of the metal pipe thorough all of leaking locations, without oversight of the leakage. After continuously supplying the He gas and confirming a drop of vacuum, the He leak rate can be calculated.

Next, a method for manufacturing an electrostatic chuck, which includes the wafer holding member 1 joined with the plate 4 of the composite material according to the present invention, will be described below.

For the plate base 7 constituting the electrostatic chuck, an aluminum nitride sintered body can used. The aluminum nitride sintered body is produced by steps of adding a IIIa group oxide of about 10 mass % in terms of weight into aluminum nitride powder, followed by mixing the powder with IPA (isopropyl alcohol) and urethane balls in a ball mill for 48 hours, followed by filtering the resulting aluminum nitride slurry with a 200-mesh screen to remove leavings of the urethane balls or a wall of the ball mill, followed by drying the slurry at 120 degree-C. for 24 hours in an explosion-proof dryer to obtain a uniform aluminum nitride mixed powder, and then mixing the mixed powder with an acrylic binder and a solvent, followed by forming a aluminum nitride of slip and taping using a doctor blade method, and then laminating a plurality of sheet of the resulting aluminum nitride tape, followed by forming an electrostatically attracting electrode of W (tungsten) on the lamination using a screen printing method, followed by applying a desired contact liquid onto an unpatterned tape, followed by laminating a plurality of sheet of the tape and press-molding them.

The resulting molded body is degreased at 500 degree-C. for about 5 hours in a flow of non-oxidizing gas flow, and sintered at 1,900 degree-C. for about 5 hours in a non-oxidizing atmosphere, resulting the aluminum nitride sintered body with the electrode 10 embedded.

The resulting aluminum nitride sintered body is machined so as to obtain the wafer holding portion 2 with a desired shape and a desired thickness of insulating layer, followed by forming a metal layer on a face opposite to the placing surface of the electrostatic attracting portion by plating, solder plating, sputtering, metalizing or the like.

The plate 4 is produced by steps of impregnating ceramic particles with a fused metal, while only heating the ceramic particles and the fused metal without pressure, in completion of impregnation, followed by heating and stirring the ceramic particles impregnated with the fused metal for 1 to 10 hours using a stirring blade rotating at 10 to 100 rpm, followed by casting them into a mold to obtain a desired shape, and then soaking it in ethyl silicate for 10 minutes, followed by drying it at 100 degree-C. for 3 hours, resulting in the plate 4. The remaining $SiO_2$ on the surface of the plate 4 is scraped off using a blade having the same material as the plate 4.

Then, on the joint face of the plate 4 containing SiC, Al and $SiO_2$, a metal layer is formed by plating, solder plating, sputtering, metalizing or the like. The plate 4 and the above-mentioned wafer holding portion 2 of aluminum nitride are joined to each other via the metal joint material 3. The metal joint material 3 preferably contains 6 to 15 mass % of Si, 0.1 to 5 mass % of Mg or Cu, and the remaining part including a main component of Al and an additive component of 0.01 to 10 mass % of at least one selected out of Ni, Au and Ag.

Then, either by joining them at desired loading weight and temperature in a non-oxidizing atmosphere or by pressing them using a hot press method at a desired temperature and a desired pressure, the wafer holding member 1 is obtained for the electrostatic chuck.

Embodiment 2

Figure 3:
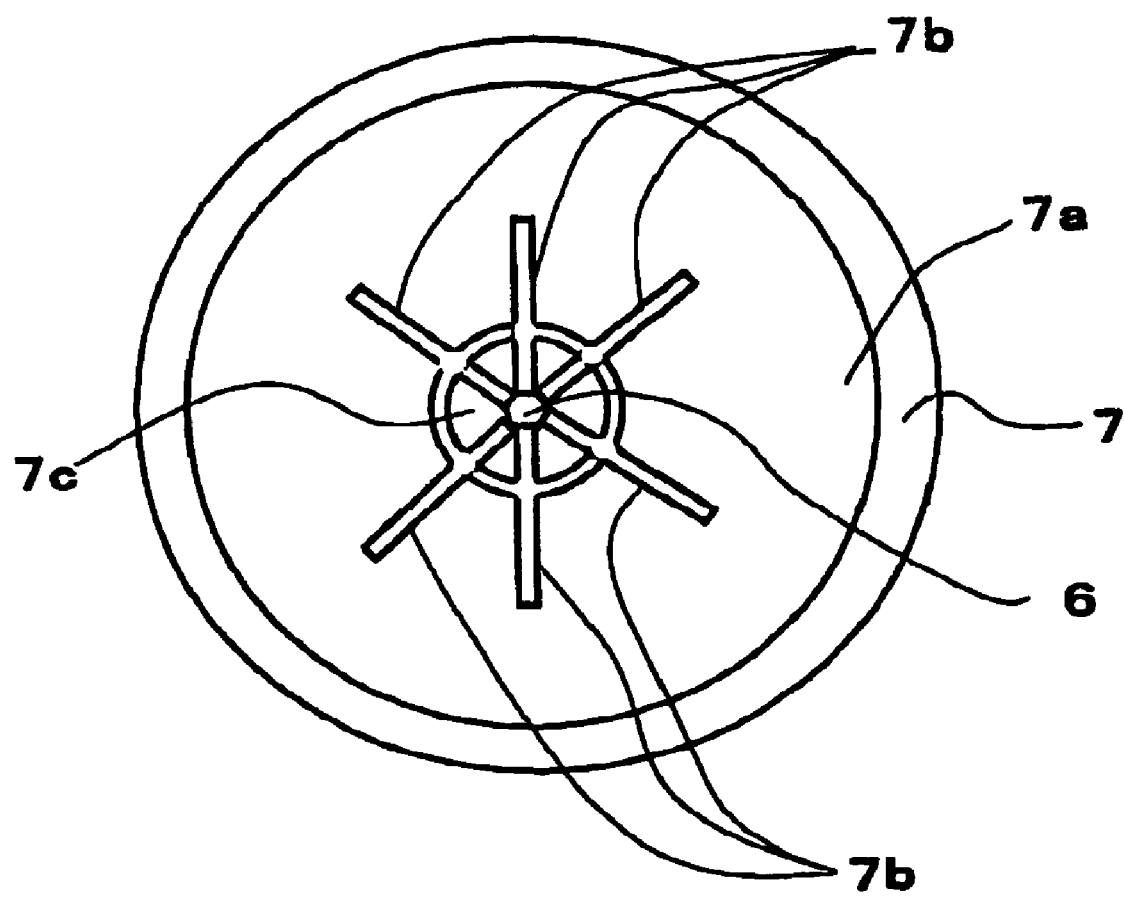
FIG. 3 is a plan view showing the second embodiment of the present invention.
Figure 4:
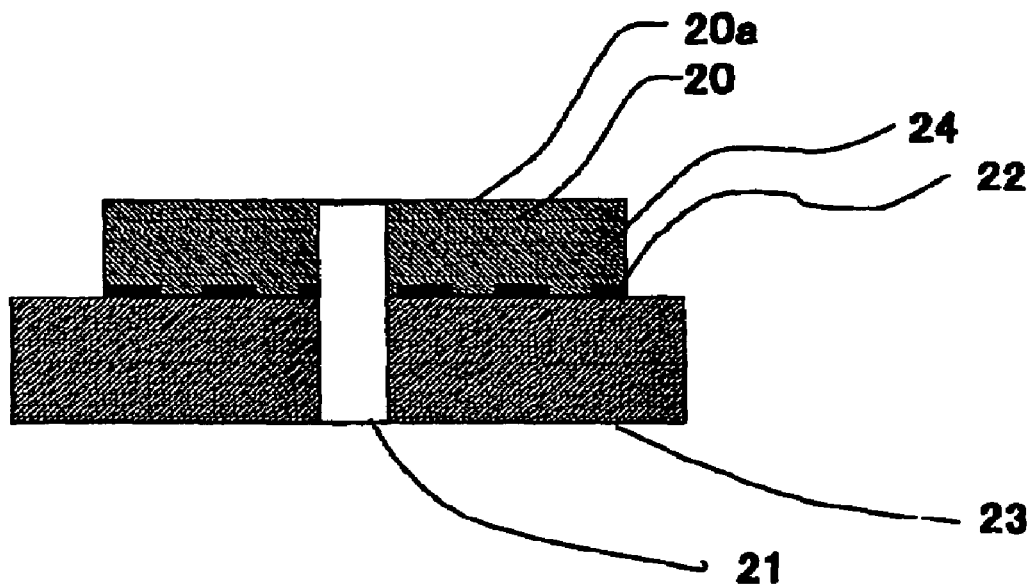
FIG. 4 is a sectional view showing an example of a conventional wafer holding member.
Figure 5:
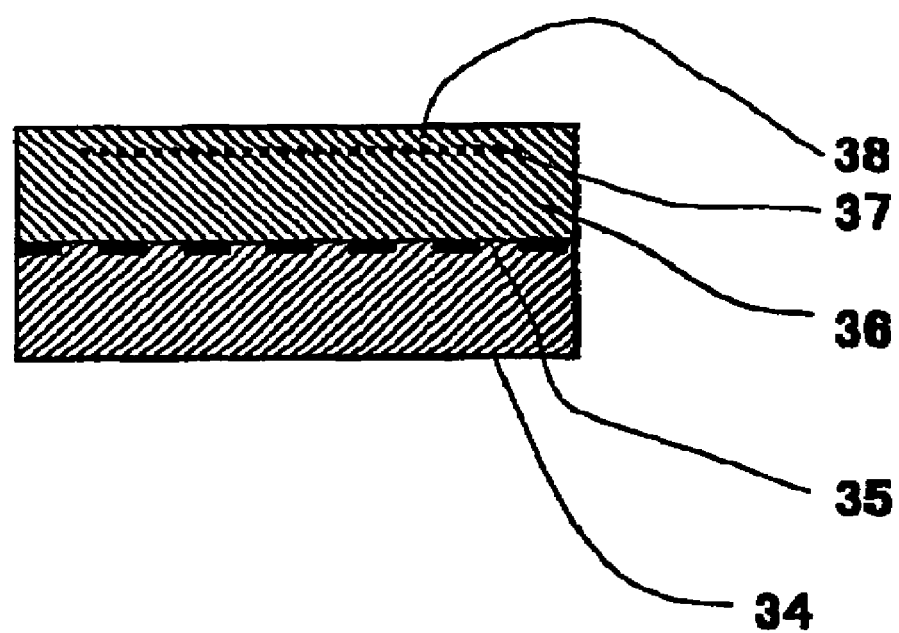
FIG. 5 is a sectional view showing another example of a conventional wafer holding member.

FIG. 2 is a sectional view showing the second embodiment of the present invention, and FIG. 3 is a plan view thereof.

The wafer holding member 1 includes a wafer holding portion 2a having a plate ceramic body 7, one principal plane of which serves as a placing surface 7a for mounting a wafer, and an electrode 10 provided either on the other principal plane or inside of the plate ceramic body 7, a composite plate 4 containing SiC, aluminum and silicon, a metal layer 8 provided on a face opposite to the placing surface 7a of the wafer holding portion 2, and a metal layer 9 provided on a face of the composite plate 4, wherein the wafer holding portion 2 and the composite plate 4 are joined to each other via a metal joint material 3 between the metal layers 8 and 9.

The plate ceramic body 7 is preferably formed of oxide ceramics, such as alumina, nitride ceramics, carbide ceramics. On the placing surface 7a, provided is a groove (not shown). When an argon gas of the like is supplied through a gas feeding hole 6 passing through the wafer holding portion 2, a space between a wafer W and the groove is filled with the gas so as to increase the thermal conductivity between the wafer W and the placing surface 7a, thereby dissipating heat of the wafer W.

The composite plate 4 is preferably formed of a composite material of metal and ceramics, with a bone structure having a three-dimensional network of porous ceramic body and porous portions closely filled with an aluminum-silicon alloy. This type of structure enables the coefficients of thermal expansion of the plate ceramic body 7 and the composite plate 4 to approximate them to each other.

Further, the material having such a large thermal conductivity of the composite plate 4 as about 160 W/(m·K) preferably can easily remove heat, which is transferred from an atmosphere, like plasma, to the wafer W, through the composite plate 4.

In the composite plate 4, provided is a passage 4a for running a coolant through to remove the heat of the wafer W to outside by means of the coolant, thereby easily controlling the temperature of the wafer W with the temperature of the coolant.

When applying several hundreds volts of attraction voltage between the attraction electrodes 10 via feeding terminals 5a and 5b with the wafer W mounted on the placing surface 7a, an electrostatic attracting force emerges between the attraction electrodes 10 and the wafer W to attract the wafer W toward the placing surface 7a. In addition, in case applying an RF voltage between the composite plate 4 and a counter electrode (not shown), plasma can be generated effectively above the wafer W.

The wafer holding member 1 according to the present invention, is not a composite material composed of two components of aluminum and SiC, but includes the composite plate containing SiC, aluminum and silicon with a metal layer 9 having a thickness of 1 to 200 μm formed thereon. Combination of aluminum and silicon in the composite plate 4 allows an eutectic material of aluminum-silicon series in producing the composite plate 4, thereby improving the degree of adhesion with the metal layer 9. Since silicon has a good adhesiveness with the metal layer 9, the composite plate 4 has a firm adhesion with the metal layer 9.

The metal layer 9 formed on the composite plate 4 has an improved wetting with the metal joint material 3 in comparison with a composite material composed of two components of aluminum and SiC. There is no cavity between the metal joint material and the composite material of SiC, aluminum and Si, thereby ensuring the reliability under the thermal shock cycle of −40 to 150 degree-C.

Further, the similar metal layer 8 is also needed to be formed on the back face of the plate ceramic body 7. In a case the metal layer 8 is not formed on the plate ceramic body 7, the metal joint material 3 and the plate ceramic body 7 are joined only by an anchor effect. In another case the metal layer 8 is formed on the plate ceramic body 7, mutual diffusion of the metal layer 8 and the metal joint material 3 allows a firmer adhesion than the mere anchor effect.

The metal layers 8 and 9 have functions of uniformizing the joint strength, as well as improving the wetting between the composite plate 4 and the metal joint material 3 and attaining the firm adhesion between the plate ceramic body 7 and the metal joint material 3. In case the metal joint material 3 is joined directly to the composite plate 4 or the plate ceramic body 7, some weak portions in joint strength, which always exist on the side of either the composite plate 4 or the plate ceramic body 7, may cause cracking in joining using the metal joint material. To attain the effect according to the present invention, such metallized faces are needed to be formed both between the composite plate 4 and the metal joint material 3, and between the plate ceramic body 7 and the metal joint material 3.

Here, the ratio tm/t of the thickness tm of the metal layer 9 to the thickness t of the metal joint material 3 is preferably in a range of 0.01 to 1. In a case the ratio tm/t is below 0.01, the composite plate 4 may not be covered over the whole area with the metal layer 8. In another case the ratio tm/t exceeds 1, the difference in coefficient of thermal expansion between the metal layer 9 and the composite plate 4, the plate ceramic body 7 or the metal joint material 3 may cause minute cracks in the metal layer 8, thereby causing variation in joint strength.

When the ratio tm/t is in a range of 0.01 to 1, the electrostatic chuck, which includes the plate ceramic body 7 with a diameter of 300 mm, the metal joint material 3, the composite plate 4, the feeding terminals 5, the gas feeding hole 6, the placing surface 7a, and the metal layers 8 and 9 formed on the interfaces between the plate ceramic body 7 and the composite plate 4, has the reliability of withstanding 1,000 cycles or more of the thermal shock cycle test of −40 to 150 degree-C.

Incidentally, the prior document 5 discloses a joint structure of a wafer holding portion and a metal member which are relatively easy to join to each other. This is quite different in joining of the composite plate different from the metal member.

Further, the prior document 2 discloses a composite material containing main components of aluminum and SiC. While, the present invention is quite different in an inventive concept of containing an additional silicon, and providing metal layers on the both sides of the composite plate and the wafer holding portion, thereby peculiarizing a synergy effect.

Furthermore, the metal layer 9 preferably has a main component of one or two or more selected out of aluminum, gold, silver, copper and nickel. When an aluminum brazing material of aluminum and silicon is used for the metal joint material 3, selection of the metal layer 9 having a main component of one or two or more selected out of aluminum, gold, silver, copper and nickel, which has a good compatibility and wetting with the aluminum brazing material, allows a extremely firm adhesion. In addition, the wafer holding member 1, which includes the plate ceramic body 7 with a diameter of 300 mm, the composite plate 4, the feeding terminals 5, the gas feeding hole 6, the placing surface 7a, and the metal layer 8 formed on the interface between the plate ceramic body 7 and the composite plate 4, has the reliability of withstanding 10,000 cycles or more of the thermal shock cycle test of −40 to 150 degree-C.

The metal joint material 3 is preferably a brazing material having a main component of aluminum, and also preferably a brazing material having a main component of indium with a similar effect.

Incidentally, for combination of the metal joint material 3 and the metal layers 8 and 9, different sorts of metal materials are preferably used.

The wafer is attracted by an electrostatic attracting force generated by applying a voltage to the electrode 10 via the feeding terminals 5a and 5b during deposition or etching in a vacuum chamber. In completion of deposition or etching, the wafer is released by turning off the voltage applied to the feeding terminals 5a and 5b. In order to neutralize electric charges accumulated on the placing surface 7a for quick release, a volume resistivity of the plate ceramic body is preferably in a range of $10^8$ to $10^{11}$ ohm·cm. A conductive layer, e.g., the metal layers 8 and 9 or the joint layer 3 or the composite plate 4, is provided a face opposite to the placing surface 7a, and an area of the conductive layer projected to the placing surface 7a is preferably 100% or more, more preferably 115% or more of an area of the placing surface 7a. In order to generate an electrostatic attracting force due to Johnson-Rahbec force by accumulating electric charges on the placing surface 7a, it is important to have $10^8$ ohm·cm or more. In order to release the wafer quickly after attraction, the electric charges accumulated on the placing surface 7a are needed to disappear quickly. In case the volume resistivity exceeds $10^{11}$ ohm·cm, the electric charges hardly disappear with a possibility of a residual attracting force remaining for long hours. The volume resistivity of the plate ceramic body 7 is importantly $10^{11}$ ohm·cm or below to suppress the residual attracting force.

However, nearly 10,000 cycles of repetition including steps of attracting the wafer W by an electrostatic attracting force generated by applying a voltage to the electrode 10 via the feeding terminals 5a and 5b, and then depositing or etching the wafer W in a vacuum chamber, and then in completion of deposition or etching, releasing the wafer W by turning off the voltage applied to the feeding terminals 5a and 5b, may cause the residual attracting force. In order to dissipate the electric charges accumulated on the placing surface 7a quickly for releasing the wafer W even after 100,000 cycles of repetition of wafer attraction and release, an escape area for the electric charges accumulated on the placing surface 7a is needed. When the projected area of the conductive layer, which functions as the escape area for the electric charges, is preferably 100% or more of the area of the placing surface 7a, the wafer holding member 1, in which a large residual attracting force hardly emerges even after 100,000 cycles or more of repetition of wafer attraction and release, can be obtained. When turning off the voltage applied to the feeding terminals 5a and 5b, the electric charges accumulated on the placing surface 7a move in a neutralizing direction. In case further applying the voltage to the feeding terminals 5a and 5b before the plate ceramic body 7 is electrically neutralized completely, some moving electric charges are likely to remain. Providing electric connection with the conductive layer, like the metal layers 8 and 9 or the joint layer 3 or the composite plate 4, whose projected area is 100% or more of the area of the placing surface 7a, facilitates the electric charges in electric non-equilibrium to be quickly absorbed in the conductive layer. Consequently, the wafer holding member 1 has a smaller residual attracting force emerging even after 100,000 cycles or more of repetition of wafer attraction and release. In addition, according to a result of research dedicated by the present inventors, the projected area of the conductive layer, that is the composite plate 4, is more preferably 115% or more of the area of the placing surface 7a, thereby obtaining the wafer holding member 1 in which no residual attracting force emerges even after 200,000 cycles or more of repetition of wafer attraction and release. The reason is imagined that, in case 115% or more of the area of the placing surface 7a, not only the electric charges accumulated on the placing surface 7a are absorbed through the plate ceramic body 7 into the composite plate 4, i.e., the conductive layer, but also the electric charges pass through the surface of the plate ceramic body 7 to be absorbed into the composite plate 4.

Further, in order to effectively dissipate the residual electric charges remaining on the placing surface 7a into the lower conductive layer, the distance from the placing surface 7a to the conductive layer is preferably small. Since the volume resistivity of the plate ceramic body 7 is in the above-mentioned range, the thickness of the plate ceramic body 7 is preferably 15 mm or below. In case the thickness of 15 mm or below, the residual electric charges on the placing surface 7a can move toward the conductive layer in a short time as quickly as 3 seconds or less, so that the residual attracting force preferably disappears quickly. The thickness of the plate ceramic body 7 is more preferably 11 mm or below, yet more preferably 8 mm or below.

Furthermore, the wafer holding member preferably includes a through-hole 6 passing through the plate ceramic body 7 and a groove communicating with the through-hole, provided on the placing surface 7a, wherein a depth of the groove is in a range of 10 to 500 μm. In case the depth of the groove is under the 10 μm, the thermal conductivity between the placing surface 7a and the wafer is reduced because of an argon gas introduced in the groove, unsuitably with the cooling efficiency of the wafer reduced. In case over 500 μm, the residual electric charges on the placing surface 7a hardly pass through the surface into the conductive layer. The depth of the groove is more preferably in a range of 50 to 300 μm.

Moreover, as shown in FIG. 3, when the residual electric charges on the placing surface 7a pass through the surface into the conductive layer, the residual electric charges remaining in the center of the placing surface 7a hardly escape away. In particular, in case protrusions 7c, like an island, are formed in the vicinity of the center of the placing surface 7a, the residual electric charges remaining at the bottom of the protrusions hardly escape away. The groove preferably includes radial grooves 7b radially extending from the center to the circumference of the plate ceramic body 7, so that the residual electric charges remaining in the center of the placing surface 7a can quickly move toward the outer circumference of the placing surface 7a.

Further, when the length of the radial groove 7b is preferably one-third or more of the radius of the plate ceramic body 7, the residual electric charges remaining in the center of the placing surface 7a can quickly move toward the circumference of the placing surface 7a, so that the residual attracting force can be reduced quickly, thereby easily releasing the wafer.

Moreover, the weight ratio (Al/Si) of Al to Si in the composite plate 4 is preferably in a range of 0.1 to 6. In case the weight ratio Al/Si is below 0.1, the interface between the composite plate 4 and the metal joint material 3 becomes too brittle due to excessive Si, which may cause cracking in joining. Further, since Al has basically a bad wetting with SiC and Si and is easy to be unevenly distributed, Al is likely to be precipitated on the surface in comparison with Si. In case the weight ratio Al/Si is over 6, an area occupied by Al may exceed 80% in the face of the composite plate 4 in contact with the metal layer, thereby significantly degrading the wetting of Al with another metal material. Unsuitably, cavities or voids emerging in the metal layers 8 and 9 or the metal joint material 3 may cause degrading of the vacuum gas-tightness. In case the weight ratio Al/Si is below 0.1, the area occupied by Al becomes below 5%, which may greatly reduce the thermal conductivity between the plate ceramic body 7 and the composite plate 4. Unsuitably, the wafer holding member 1 may not have a cooling function.

Further, when joining the wafer holding portion 2 with the composite plate 4 using the metal joint material 3, it is preferable that a pressing force having a average pressure of 10 to 200 kPa is applied in a direction vertical to each of the joint faces.

The metal joint between the wafer holding portion 2 and the composite plate 4 can be attained either by applying a desired loading weight to the joint faces or by pressing them at a desired temperature and a desired pressure using a hot press method. At this time, it is preferable that variation in thickness of the metal joint material 3 is distributed in a range of the center value ±30%. In order to attain the variation in thickness of the metal joint material 3 in a range of the center value ±30%, the loading weight applied for joining is preferably in a range of 10 to 200 kPa. In case the loading weight below 10 kPa, uniformity in thickness of the metal joint material cannot be sufficiently obtained. When joining an electrostatic chuck with a diameter of over 200 mm, partial cracking occurs with a large He leak rate.

On the other hand, in case the pressure applied vertically to the metal joint material 3 is over 200 kPa, the thickness of the metal joint material 3 is easily made uneven in the center and outer portions of the wafer holding portion 2. Excessive small thickness in the center of the metal joint material 3 cannot attain a sufficient anchor effect, unsuitably with a large He leak rate.

Next, a method for manufacturing the wafer holding member 1 according to the present invention will be described below with an example of an electrostatic chuck.

For the plate ceramic body 7 constituting the electrostatic chuck, an aluminum nitride sintered body can used. The aluminum nitride sintered body is produced by steps of adding a IIIa group oxide of about 10 mass % in terms of weight into aluminum nitride powder, followed by mixing the powder with IPA (isopropyl alcohol) and urethane balls in a ball mill for 48 hours, followed by filtering the resulting aluminum nitride slurry with a 200-mesh screen to remove leavings of the urethane balls or a wall of the ball mill, followed by drying the slurry at 120 degree-C. for 24 hours in an explosion-proof dryer to obtain a uniform aluminum nitride mixed powder.

Then, the above-mentioned steps are followed by mixing the mixed powder with an acrylic binder and a solvent, followed by forming a aluminum nitride of slip and taping using a doctor blade method, and then laminating a plurality of sheet of the resulting aluminum nitride tape, followed by forming an electrostatically attracting electrode of W (tungsten) on the lamination using a screen printing method, followed by applying a desired contact liquid onto an unpatterned tape, followed by laminating a plurality of sheet of the tape and press-molding them.

The resulting molded body is degreased at 500 degree-C. for about 5 hours in a flow of non-oxidizing gas, and sintered at 1,900 degree-C. for about 5 hours in a non-oxidizing atmosphere, resulting the aluminum nitride sintered body with the electrode 10 embedded.

The resulting aluminum nitride sintered body is machined so as to obtain the wafer holding portion 2 with a desired shape and a desired thickness of the insulating layer, followed by forming the metal layer 8 on a face opposite to the placing surface of the electrostatic attracting portion by plating, solder plating, sputtering, metalizing or the like.

The composite plate 4 is produced by steps of impregnating ceramic particles with a fused metal, while only heating the ceramic particles and the fused metal without pressure, in completion of impregnation, followed by heating and stirring the ceramic particles impregnated with the fused metal for 1 to 10 hours using a stirring blade rotating at 10 to 100 rpm, followed by casting them into a mold to obtain a desired shape, resulting in the composite plate 4.

Then, the metal layer 9 is also formed on the joint face of the composite plate 4 containing SiC, Al and Si. The composite plate 4 and the wafer holding portion 2 are joined to each other via the metal joint material 3. For the metal joint material 3, aluminum or indium brazing material is preferably selected.

Then, either by joining them at desired loading weight and temperature in a non-oxidizing atmosphere or by pressing them using a hot press method at a desired temperature and a desired pressure, the wafer holding member 1 is obtained.

EXAMPLE 1

A fusion solidified body containing 74 mass % of SiC, 15.6 mass % of Al, 10.4 mass % of Si, and another solidified body containing 84.4 mass % of SiC, 15.6 mass % of Al, 0 mass % of Si, and the other solidified body containing 89.6 mass % of SiC, 0 mass % of Al, 10.4 mass % of Si, were produced. Then, while changing time of soaking each of the fusion solidified bodies in ethyl silicate, each composite material having a different content of $SiO_2$ was produced. The produced composite material had dimensions of 50 mm×50 mm×5 mm.

Then, each He leak rate was measured. Measurement of He leak rate included steps of finishing the surface of the above-mentioned composite material up to a roughness of Ra 0.1 to 0.2 μm using diamond powder of 5 μm, followed by attaching the surface of the composite material with a metal pipe integrated with an O-ring having an internal diameter of 30 mm and an external diameter of 34 mm, followed by vacuuming the inside room of the pipe, followed by putting the vacuumed pipe in a vinyl bag or a desired shape of casing, which is filled with a He gas. The He gas was introduced into the inside room of the metal pipe thorough all of leaking locations, while measuring this gas flow to calculate the He leak rate. Each content of each component of the composite material was analyzed using ICP (Inductively Coupled Plasma). The contents of SiC and $SiO_2$ were estimated by determining the quantity of Si using ICP and quantitatively analyzing oxygen and carbon, and then regarding the content of carbon as SiC and the content of oxygen as $SiO_2$. Incidentally, there was a little oxygen coupled to Al, but it was determined that all the content of oxygen originated from $SiO_2$ because of extremely slight oxygen coupled to Al.

The result is shown in Table 1.

TABLE 1

| Sample No. | Contents of composite material | | | | He leak rate ($Pa \cdot m^3$/sec) |
|---|---|---|---|---|---|
| | SiC (mass %) | Al (mass %) | Si (mass %) | $SiO_2$ (mass %) | |
| 101 | 74.0 | 15.6 | 10.4 | 0.001 | $1.30 \times 10^{-10}$ |
| 102 | 74.0 | 15.6 | 10.4 | 0.002 | $1.25 \times 10^{-10}$ |
| 103 | 74.0 | 15.6 | 10.4 | 0.003 | $1.20 \times 10^{-10}$ |
| 104 | 84.4 | 15.6 | 0.0 | 0.004 | $1.15 \times 10^{-10}$ |
| 105 | 89.6 | 0.0 | 10.4 | 0.005 | $1.10 \times 10^{-10}$ |
| 106 | 74.0 | 15.6 | 10.4 | 0.010 | $8.0 \times 10^{-11}$ |
| *107 | 74.0 | 15.6 | 10.4 | 0 | $1 \times 10^{-9}$ |
| *108 | 74.0 | 15.6 | 10.4 | 0 | $1 \times 10^{-9}$ |

Note:
Samples marked with "*" are outside the scope of the invention.

The samples No. 101 to 106, which were the composite material according to the present invention being composed of SiC, $SiO_2$, at least one out of Al and Si, showed excellent characteristics with He leak rate of $1.3 \times 10^{-10}$ $Pa \cdot m^3$/sec or below.

On the other hand, the samples No. 107 to 108 showed poor vacuum gas-tightness with He leak rate as large as $1.1 \times 10^{-9}$ $Pa \cdot m^3$/sec.

EXAMPLE 2

In order to determine the content range of a composite material having smaller He leak rate, better thermal and mechanical characteristics than those of the composite material produced in Example 1, fusion solidified bodies having each of contents in ranges of 69 to 80 mass % of SiC, 9.6 to 21.6 mass % of Al, 4.4 to 16.4 mass % of Si, were produced. Then, while changing time of soaking each of the fusion solidified bodies in ethyl silicate, each composite material having a different content of $SiO_2$ was produced. The produced composite material had dimensions of 50 mm×50 mm×5 mm.

Then, each He leak rate of the composite materials was measured similarly to Example 1.

Further, for measurement of the Weibull modulus, 30 test pieces were cut out of each fusion solidified body, and then while changing time of soaking each piece in ethyl silicate, each composite material having a different content of $SiO_2$ was produced for each test piece. The four-point bending strength of each test piece was measured in compliance with JIS (Japanese Industrial Standards) R1601-1995. The Weibull modulus was calculated based on the strength data using a method of maximum likelihood.

For measurement of the thermal conductivity, 5 test pieces with a diameter of 10 mm and a thickness of 2 mm were cut out of each fusion solidified body, and then while changing time of soaking each piece in ethyl silicate, each composite material having a different content of $SiO_2$ was produced for each test piece. The thermal conductivity of each test piece was measured using a laser flash method.

For measurement of the coefficient of thermal expansion, 5 test pieces were cut out of each fusion solidified body, and then while changing time of soaking each piece in ethyl silicate, each composite material having a different content of $SiO_2$ was produced for each test piece. The coefficient of thermal expansion of each test piece was measured in compliance with JIS R1618-1994.

Each content of the composite material was analyzed using ICP. The contents of SiC and SiO$_2$ were estimated by determining the quantity of Si using ICP and quantitatively analyzing oxygen and carbon, and then regarding the content of carbon as SiC and the content of oxygen as SiO$_2$. Incidentally, there was a little oxygen coupled to Al, but it was determined that all the content of oxygen originated from SiO$_2$ because of extremely slight oxygen coupled to Al$_2$O$_3$.

The result is shown in Table 2.

and 130 had the Si content of 5.4 and 15.4 mass %, respectively, and preferably both the coefficient of thermal expansion of 5.6×10$^{-6}$ to 5.8×10$^{-6}$/degree-C., and excellently the thermal conductivity of 170 W/(m·K) or more. Accordingly, it could be seen that the Si content of 5.4 to 15.4 mass % was preferable.

Further, the sample No. 135 had the SiO$_2$ content of 0.005 mass % in the composite material, therefore, and the He leak rate as slightly large as 1.1×10$^{-10}$ Pa·m$^3$/sec. The sample No. 136 had the SiO$_2$ content of 6 mass % in the composite

TABLE 2

| Sample No. | Contents of composite material | | | | He leak rate (Pa · m$^3$/sec) | Weibull modulus | Thermal conductivity (W/(m · K)) | Coefficient of thermal expansion (×10$^{-6}$/C.) |
|---|---|---|---|---|---|---|---|---|
| | SiC (mass %) | Al (mass %) | Si (mass %) | SiO$_2$ (mass %) | | | | |
| 121 | 69.000 | 19.535 | 11.365 | 0.100 | 7.0 × 10$^{-11}$ | 6 | 190 | 5.7 |
| 122 | 79.000 | 13.600 | 7.300 | 0.100 | 7.0 × 10$^{-11}$ | 6 | 195 | 5.8 |
| 123 | 68.000 | 20.535 | 11.365 | 0.100 | 7.0 × 10$^{-11}$ | 4 | 180 | 5.8 |
| 124 | 80.000 | 12.600 | 7.300 | 0.100 | 1.2 × 10$^{-10}$ | 5 | 185 | 5.7 |
| 125 | 78.935 | 10.600 | 10.365 | 0.100 | 7.0 × 10$^{-11}$ | 6 | 185 | 5.5 |
| 126 | 70.900 | 20.600 | 8.400 | 0.100 | 4.0 × 10$^{-11}$ | 7 | 170 | 5.7 |
| 127 | 78.935 | 9.600 | 11.365 | 0.100 | 7.0 × 10$^{-11}$ | 6 | 140 | 5.8 |
| 128 | 70.900 | 21.600 | 7.400 | 0.100 | 4.0 × 10$^{-11}$ | 7 | 160 | 6.5 |
| 129 | 77.935 | 16.565 | 5.400 | 0.100 | 6.0 × 10$^{-11}$ | 7 | 180 | 5.6 |
| 130 | 71.900 | 12.600 | 15.400 | 0.100 | 3.0 × 10$^{-11}$ | 8 | 170 | 5.8 |
| 131 | 78.935 | 16.565 | 4.400 | 0.100 | 7.0 × 10$^{-11}$ | 6 | 170 | 6.1 |
| 132 | 70.900 | 12.600 | 16.400 | 0.100 | 4.0 × 10$^{-11}$ | 7 | 140 | 5.9 |
| 133 | 73.990 | 15.600 | 10.400 | 0.010 | 6.0 × 10$^{-11}$ | 8 | 220 | 4.5 |
| 134 | 69.000 | 15.600 | 10.400 | 5.000 | 7.0 × 10$^{-11}$ | 5 | 220 | 4.5 |
| 135 | 73.995 | 15.600 | 10.400 | 0.005 | 1.1 × 10$^{-10}$ | 7 | 220 | 4.2 |
| 136 | 68.000 | 15.600 | 10.400 | 6.000 | 8.0 × 10$^{-11}$ | 4 | 220 | 3.9 |

The sample No. 123 had the SiC content of 68 mass %, therefore, the Weibull modulus as small as 4, and relatively large variation in strength of the composite material. The sample No. 124 had the SiC content of 80 mass %, therefore, the He leak rate as slightly large as 1.2×10$^{-10}$ Pa·m$^3$/sec. The samples No. 121 and 122 had the SiC content of 69 and 79 mass %, respectively, and both the Weibull modulus as large as 6, the He leak rate as small as 7×10$^{-11}$ Pa·m$^3$/sec. Accordingly, it could be seen that the SiC content of 69 to 79 mass % was preferable.

Further, the sample No. 127 had the Al content of 9.6 mass % in the composite material, therefore, and the thermal conductivity as small as 140 W/(m·K). The sample No. 128 had the Al content of 21.6 mass % in the composite material, therefore, and the coefficient of thermal expansion as large as 6.5×10$^{-6}$/degree-C. The samples No. 125 and 126 had the Al content of 10.6 and 20.6 mass %, respectively, and both the thermal conductivity of 170 W/(m·K) or more, and preferably the coefficient of thermal expansion of 5.5×10$^{-6}$ to 5.7×10$^{-6}$/degree-C. Accordingly, it could be seen that the Al content of 10.6 to 20.6 mass % was preferable.

Further, the sample No. 131 had the Si content of 4.4 mass % in the composite material, therefore, and the coefficient of thermal expansion as slightly large as 6.1×10$^{-6}$/degree-C. The sample No. 132 had the Si content of 16.4 mass % in the composite material, therefore, and the thermal conductivity as slightly small as 140 W/(m·K). But the samples No. 129 material, therefore, and the Weibull modulus as slightly small as 4, and the coefficient of thermal expansion as slightly small as 3.9×10$^{-6}$/degree-C. Meanwhile, the samples No. 133 and 134 had the He leak rate as small as 6×10$^{-11}$ to 7×10$^{-11}$ Pa·m$^3$/sec, the Weibull modulus as large as 5 to 8, and preferably the coefficient of thermal expansion of 4.5×10$^{-6}$/degree-C. Accordingly, it could be seen that the SiO$_2$ content of 0.01 to 5 mass % was preferable.

Consequently, as the samples No. 121, 122, 125, 126, 129, 130, 133, 134, when the composite material contains 69 to 79 mass % of SiC, 10.6 to 20.6 mass % of Al, 5.4 to 15.4 mass % of Si, and 0.01 to 5 mass % of SiO$_2$, preferably, the composite material can attain the He leak rate of 8.0×10$^{-11}$ Pa·m$^3$/sec or below, the Weibull modulus of 5 or more, the thermal conductivity of 160 W/(m·K) or more, and the coefficient of thermal expansion of 4×10$^{-6}$ to 6×10$^{-6}$/degree-C.

EXAMPLE 3

In order to determine the content range of a composite material having still smaller He leak rate, better thermal and mechanical characteristics than those of the composite material produced in Example 2, fusion solidified bodies having each of contents in ranges of 71.5 to 76.5 mass % of SiC, 12.6 to 18.6 mass % of Al, 7.4 to 13.4 mass % of Si, were produced. Then, each composite material was produced and evaluated in a manner similar to Example 2.

The result is shown in Table 3.

TABLE 3

| Sample No. | Contents of composite material | | | | He leak rate (Pa · m³/sec) | Weibull modulus | Thermal conductivity (W/(m · K)) | Coefficient of thermal expansion (×10⁻⁶/C.) |
|---|---|---|---|---|---|---|---|---|
| | SiC (mass %) | Al (mass %) | Si (mass %) | SiO₂ (mass %) | | | | |
| 141 | 71.500 | 17.050 | 11.350 | 0.100 | $3.0 \times 10^{-11}$ | 9 | 210 | 5.3 |
| 142 | 76.500 | 14.600 | 8.800 | 0.100 | $3.0 \times 10^{-11}$ | 9 | 210 | 5.3 |
| 143 | 71.000 | 17.550 | 11.350 | 0.100 | $3.0 \times 10^{-11}$ | 7 | 210 | 5.3 |
| 144 | 77.000 | 14.100 | 8.800 | 0.100 | $5.0 \times 10^{-11}$ | 8 | 210 | 5.3 |
| 145 | 75.900 | 13.100 | 10.900 | 0.100 | $3.0 \times 10^{-11}$ | 11 | 205 | 5.3 |
| 146 | 72.500 | 18.100 | 9.300 | 0.100 | $2.0 \times 10^{-11}$ | 12 | 205 | 5.4 |
| 147 | 75.900 | 12.600 | 11.400 | 0.100 | $3.0 \times 10^{-11}$ | 11 | 190 | 5.5 |
| 148 | 72.500 | 18.600 | 8.800 | 0.100 | $2.0 \times 10^{-11}$ | 12 | 200 | 5.7 |
| 149 | 75.400 | 16.600 | 7.900 | 0.100 | $3.0 \times 10^{-11}$ | 12 | 205 | 5.3 |
| 150 | 72.400 | 14.600 | 12.900 | 0.100 | $2.0 \times 10^{-11}$ | 13 | 205 | 5.4 |
| 151 | 75.900 | 16.600 | 7.400 | 0.100 | $3.0 \times 10^{-11}$ | 11 | 200 | 5.6 |
| 152 | 71.900 | 14.600 | 13.400 | 0.100 | $3.0 \times 10^{-11}$ | 8 | 190 | 5.3 |
| 153 | 73.950 | 15.600 | 10.400 | 0.050 | $2.0 \times 10^{-11}$ | 14 | 220 | 4.5 |
| 154 | 72.000 | 15.600 | 10.400 | 2.000 | $3.0 \times 10^{-11}$ | 8 | 220 | 4.5 |
| 155 | 73.960 | 15.600 | 10.400 | 0.040 | $4.0 \times 10^{-11}$ | 10 | 220 | 4.5 |
| 156 | 71.900 | 15.600 | 10.400 | 2.100 | $3.0 \times 10^{-11}$ | 7 | 220 | 4.4 |

The sample No. 143 had the SiC content of 71 mass %, therefore, the Weibull modulus as small as 7, and relatively large variation in strength of the composite material. The sample No. 144 had the SiC content of 77 mass %, therefore, the He leak rate as slightly large as $5.0 \times 10^{-11}$ Pa·m³/sec. Meanwhile, the samples No. 141 and 142 had the SiC content of 71.5 to 76.5 mass %, respectively, and both the Weibull modulus as large as 9, the He leak rate as small as $3 \times 10^{-11}$ Pa·m³/sec. Accordingly, it could be seen that the SiC content of 71.5 to 76.5 mass % was more preferable.

Further, the sample No. 147 had the Al content of 12.6 mass % in the composite material, therefore, and the thermal conductivity as small as 190 W/(m·K). The sample No. 148 had the Al content of 18.6 mass % in the composite material, therefore, and the coefficient of thermal expansion as slightly large as $5.7 \times 10^{-6}$/degree-C. Meanwhile, the samples No. 145 and 146 had the Al contents of 13.1 to 18.1 mass % and both the thermal conductivity as large as 205 W/(m·K), and preferably the coefficient of thermal expansion of $5.3 \times 10^{-6}$ to $5.4 \times 10^{-6}$/degree-C. Accordingly, it could be seen that the Al content of 13.1 to 18.1 mass % was more preferable.

Further, the sample No. 151 had the Si content of 7.4 mass % in the composite material, therefore, and the coefficient of thermal expansion as slightly large as $5.6 \times 10^{-6}$/degree-C. The sample No. 152 had the Si content of 13.4 mass % in the composite material, therefore, and the thermal conductivity as slightly small as 190 W/(m·K). But the samples No. 149 and 150 had the Si contents of 7.9 to 12.9 mass % and preferably both the coefficient of thermal expansion of $5.3 \times 10^{-6}$ to $5.4 \times 10^{-6}$/degree-C., and excellently the thermal conductivity as large as 205 W/(m·K).

Further, the sample No. 155 had the SiO₂ content of 0.04 mass % in the composite material, therefore, and the He leak rate as slightly large as $4 \times 10^{-11}$ Pa·m³/sec. The sample No. 156 had the SiO₂ content of 2.1 mass % in the composite material, therefore, and the Weibull modulus as slightly large as 7, and the coefficient of thermal expansion as slightly small as $4.4 \times 10^{-6}$/degree-C. Meanwhile, the samples No. 153 and 154 had the He leak rate as small as $2 \times 10^{-11}$ to $3 \times 10^{-11}$ Pa·m³/sec, the Weibull modulus as large as 8 to 14, and preferably the coefficient of thermal expansion of $4.5 \times 10^{-6}$/degree-C. Accordingly, it could be seen that the SiO₂ content of 0.05 to 2 mass % was more preferable.

Consequently, as the samples No. 141, 142, 145, 146, 149, 150, 153, 154, when the composite material contains 71.5 to 76.5 mass % of SiC, 13.1 to 18.1 mass % of Al, 7.9 to 12.9 mass % of Si, and 0.05 to 2 mass % of SiO₂, more preferably, the composite material can attain the He leak rate of $3 \times 10^{-11}$ Pa·m³/sec or below, the Weibull modulus of 8 or more, the thermal conductivity of 205 W/(m·K) or more, and the coefficient of thermal expansion of $4.5 \times 10^{-6}$ to $5.4 \times 10^{-6}$/degree-C.

EXAMPLE 4

The AlN (aluminum nitride) sintered body was produced by steps of adding an oxide of about 10 mass % in terms of weight into AlN powder, followed by mixing the powder with IPA (isopropyl alcohol) and urethane balls in a ball mill for 48 hours, followed by filtering the resulting AlN slurry with a 200-mesh screen to remove leavings of the urethane balls or a wall of the ball mill, followed by drying the slurry at 120 degree-C. for 24 hours in an explosion-proof dryer to obtain a uniform AlN mixed powder, followed by mixing the mixed powder with an acrylic binder and a solvent, followed by forming a AlN of slip and taping using a doctor blade method.

Then, the above-mentioned steps were followed by laminating a plurality of sheet of the resulting AlN tape, followed by forming an electrode of W (tungsten) on the lamination using a screen printing method, followed by applying a desired contact liquid onto an unpatterned tape, followed by laminating a plurality of sheet of the tape and press-molding them.

The resulting molded body was degreased at 500 degree-C. for about 5 hours in a flow of non-oxidizing gas, and sintered at 1,900 degree-C. for about 5 hours in a non-oxidizing atmosphere, resulting the AlN dielectric sintered body.

The resulting AlN sintered body was machined so as to obtain the wafer holding portion with a desired shape and a desired thickness of the insulating layer on the placing surface and the electrode. Then, a desired shape of gas groove was formed on the placing surface using sandblast or the like.

Then, a metal layer was formed on a principal plane opposite to the placing surface of the wafer holding portion using plating.

The plate containing SiC, Al, Si and $SiO_2$, on which another metal layer was formed in such a manner as described above, was joined to the above-mentioned wafer holding portion via an Al brazing material. The coefficient of thermal expansion of the plate was adjusted so that the ratio in coefficient of thermal expansion of the composite plate to the plate base (=coefficient of thermal expansion of the composite plate/coefficient of thermal expansion of the plate base) was in a range of 0.79 to 1.21.

Further, the wafer holding portion and the plate were joined to each other in a vacuum chamber of about $1 \times 10^{-6}$ Pa at 550 to 600 degree-C. with a loading weight of 98 kPa (0.5 $kg/cm^2$), resulting in the wafer holding member. Then, after a thermocouple was attached onto the attracting surface of the plate base of the wafer holding member, a thermal shock test of maintaining a temperature of −40 degree-C. or below for 10 minutes and another temperature of 100 degree-C. for 10 minutes was performed 100 cycles.

The result is shown in Table 4.

plate base, which were excellent because no crack occurred in the plate base under the thermal shock cycle.

EXAMPLE 5

The AlN (aluminum nitride) sintered body was produced by steps of adding a Ce oxide of about 10 mass % in terms of weight into AlN powder, followed by mixing the powder with IPA (isopropyl alcohol) and urethane balls in a ball mill for 48 hours, followed by filtering the resulting AlN slurry with a 200-mesh screen to remove leavings of the urethane balls or a wall of the ball mill, followed by drying the slurry at 120 degree-C. for 24 hours in an explosion-proof dryer to obtain a uniform AlN mixed powder, followed by mixing the mixed powder with an acrylic binder and a solvent, followed by forming a AlN of slip and taping using a doctor blade method.

Then, the above-mentioned steps were followed by laminating a plurality of sheet of the resulting AlN tape, followed by forming an electrode of W (tungsten) on the lamination using a screen printing method, followed by applying a desired contact liquid onto an unpatterned tape, followed by laminating a plurality of sheet of the tape and press-molding them.

TABLE 4

| SAMPLE NO. | COEFFICIENT OF THERMAL EXPANSION OF PLATE BASE: CA ($\times 10^{-6}$/C.) | CONTENTS OF PLATE BASE | COEFFICIENT OF THERMAL EXPANSION OF COMPOSITE MATERIAL: CB ($\times 10^{-6}$/C.) | RATIO IN COEFFICIENT OF THERMAL EXPANSION (CB/CA) | THERMAL SHOCK TEST |
|---|---|---|---|---|---|
| 161 | 5.00 | ALN 90 MASS %, $CEO_2$ 10 MASS % | 4.00 | 0.80 | NO CRACK |
| 162 | 5.20 | ALN 90 MASS %, $Y_2O_3$ 10 MASS % | 4.50 | 1.16 | NO CRACK |
| 163 | 5.10 | ALN 90 MASS %, $YB_2O_3$ 10 MASS % | 5.00 | 1.02 | NO CRACK |
| 164 | 5.00 | ALN 90 MASS %, $CEO_2$ 10 MASS % | 5.50 | 1.10 | NO CRACK |
| 165 | 5.00 | ALN 90 MASS %, $CEO_2$ 10 MASS % | 6.00 | 1.20 | NO CRACK |
| *166 | 5.00 | ALN 90 MASS %, $CEO_2$ 10 MASS % | 3.95 | 0.79 | CRACKING |
| *167 | 5.00 | ALN 90 MASS %, $CEO_2$ 10 MASS % | 6.05 | 1.21 | CRACKING |

NOTE:
SAMPLES MARKED WITH "*" ARE OUTSIDE THE SCOPE OF THE INVENTION.

Since the sample No. 166 had the coefficient of thermal expansion of the composite material being 0.79 times as large as the coefficient of thermal expansion of the plate base, the difference in coefficient of thermal expansion between the plate base and the composite material was enlarged, thereby causing cracking in the plate base under the thermal shock cycle.

Since the sample No. 167 had the coefficient of thermal expansion of the composite material being 1.21 times as large as the coefficient of thermal expansion of the plate base, the difference in coefficient of thermal expansion between the plate base and the composite material was enlarged, thereby causing cracking in the plate base under the thermal shock cycle.

Consequently, it could be seen that the samples No. 161 to 165, within the scope of the present invention, had the coefficient of thermal expansion of the plate being 0.8 to 1.2 times as large as the coefficient of thermal expansion of the The resulting molded body was degreased at 500 degree-C. for about 5 hours in a flow of non-oxidizing gas, and sintered at 1,900 degree-C. for about 5 hours in a non-oxidizing atmosphere, resulting the AlN sintered body.

The resulting AlN sintered body was machined so as to obtain a desired shape and a desired thickness of the insulating layer on the placing surface and the electrode. Then, a desired shape of gas groove was formed on the placing surface using sandblast or the like.

Then, a metal layer was formed on a principal plane opposite to the placing surface of the plate base using plating, resulting in the wafer holding portion.

The plate containing SiC, Al, Si and $SiO_2$, on which another metal layer was formed in such a manner as described above, was joined to the above-mentioned wafer holding portion via a metal joint material with various contents. The coefficient of thermal expansion of the plate was adjusted so that the ratio in coefficient of thermal expansion of the plate to the plate base (=coefficient of thermal expansion of the plate/coefficient of thermal expansion of the plate base) was 1.00.

Further, the above-mentioned joint was preformed in a vacuum chamber of about $1\times10^{-6}$ Pa via a metal joint material with various contents at 550 to 600 degree-C. with a loading weight of 98 kPa (0.5 kg/cm$^2$), resulting in the wafer holding member. Then, after a thermocouple was attached onto the attracting surface of the plate base of the wafer holding member, a thermal shock test of maintaining a temperature of −40 degree-C. or below for 10 minutes and another temperature of 200 degree-C. for 10 minutes was performed 100 cycles. In addition, the sample which was not cracked in the plate base under the thermal shock cycle test was examined using a He leak test, as shown in FIG. 1B, of vacuuming from the back face with the through-hole in the center sealed by a Si rubber.

The result is shown in Table 5.

the metal joint material, and the brazing material was cracked under the thermal shock cycle, with the He leak rate as large as $1\times10^{-8}$ Pa·m$^3$/sec.

The sample No. 192 had the Ni content of 0.009 mass % in the metal joint material, and the brazing material was cracked under the thermal shock cycle, with the He leak rate as large as $1\times10^{-8}$ Pa·m$^3$/sec. The sample No. 193 had the Ni content of 11.00 mass % in the metal joint material, and the brazing material was cracked under the thermal shock cycle, with the He leak rate as large as $5\times10^{-8}$ Pa·m$^3$/sec. The sample No. 194 had the Au content of 0.009 mass % in the metal joint material, and the brazing material was cracked under the thermal shock cycle, with the He leak rate as large as $1\times10^{-8}$ Pa·m$^3$/sec.

The sample No. 195 had the Au content of 11.00 mass % in the metal joint material, and the brazing material was cracked under the thermal shock cycle, with the He leak rate as large as $5\times10^{-8}$ Pa·m$^3$/sec. The sample No. 196 had the

TABLE 5

| SAMPLE NO. | CONTENTS OF METAL JOINT MATERIAL | | | | | | | BRAZING TEMPERATURE (C.) | THERMAL CYCLE TEST | HE LEAK RATE (PA·M$^3$/SEC) |
|---|---|---|---|---|---|---|---|---|---|---|
| | MAIN COMPONENT | | | | ADDITIVE COMPONENT | | | | | |
| | AL (MASS %) | SI (MASS %) | CU (MASS %) | MG (MASS %) | NI (MASS %) | AU (MASS %) | AG (MASS %) | | | |
| 181 | 90.00 | 9.00 | 1.00 | 0.00 | 1.20 | 0.00 | 0.00 | 580 | NO CRACK | $3\times10^{-11}$ |
| 182 | 90.00 | 9.00 | 1.00 | 0.00 | 0.00 | 2.00 | 0.00 | 580 | NO CRACK | $4\times10^{-11}$ |
| 183 | 90.00 | 9.00 | 1.00 | 0.00 | 0.00 | 0.00 | 2.00 | 550 | NO CRACK | $5\times10^{-11}$ |
| 184 | 87.00 | 9.00 | 4.00 | 0.00 | 1.20 | 0.00 | 0.00 | 550 | NO CRACK | $2\times10^{-11}$ |
| 185 | 87.00 | 9.00 | 0.00 | 4.00 | 1.20 | 0.00 | 0.00 | 560 | NO CRACK | $1\times10^{-11}$ |
| *186 | 94.00 | 5.00 | 1.00 | 0.00 | 1.20 | 0.00 | 0.00 | 650 | NO CRACK | $1\times10^{-7}$ |
| *187 | 83.00 | 16.00 | 1.00 | 0.00 | 1.20 | 0.00 | 0.00 | 670 | CRACKING | $1\times10^{-7}$ |
| *188 | 90.91 | 9.00 | 0.09 | 0.00 | 1.20 | 0.00 | 0.00 | 660 | CRACKING | $1\times10^{-7}$ |
| *189 | 85.00 | 9.00 | 6.00 | 0.00 | 1.20 | 0.00 | 0.00 | 555 | CRACKING | $1.2\times10^{-8}$ |
| *190 | 90.91 | 9.00 | 0.00 | 0.09 | 1.20 | 0.00 | 0.00 | 660 | CRACKING | $1\times10^{-7}$ |
| *191 | 85.00 | 9.00 | 0.00 | 6.00 | 1.20 | 0.00 | 0.00 | 560 | CRACKING | $1\times10^{-8}$ |
| *192 | 90.00 | 9.00 | 1.00 | 0.00 | 0.009 | 0.00 | 0.00 | 580 | CRACKING | $1\times10^{-8}$ |
| *193 | 90.00 | 9.00 | 1.00 | 0.00 | 11.00 | 0.00 | 0.00 | 650 | CRACKING | $5\times10^{-8}$ |
| *194 | 90.00 | 9.00 | 1.00 | 0.00 | 0.00 | 0.009 | 0.00 | 580 | CRACKING | $1\times10^{-8}$ |
| *195 | 90.00 | 9.00 | 1.00 | 0.00 | 0.00 | 11.00 | 0.00 | 650 | CRACKING | $5\times10^{-8}$ |
| *196 | 90.00 | 9.00 | 1.00 | 0.00 | 0.00 | 0.00 | 0.009 | 580 | CRACKING | $1\times10^{-8}$ |
| *197 | 90.00 | 9.00 | 1.00 | 0.00 | 0.00 | 0.00 | 11.00 | 650 | CRACKING | $5\times10^{-8}$ |

NOTE:
SAMPLES MARKED WITH "*" ARE OUTSIDE THE SCOPE OF THE INVENTION.

The sample No. 186 had the Si content of 5.00 mass % in the metal joint material, therefore, and the brazing temperature as high as 650 degree-C., and the brazing material was cracked under the thermal shock cycle, with the He leak rate as large as $1\times10^{-7}$ Pa·m$^3$/sec. The sample No. 187 had the Si content of 16.00 mass % in the metal joint material, therefore, and the brazing temperature as high as 670 degree-C., and the brazing material was cracked under the thermal shock cycle, with the He leak rate as large as $1\times10^{-7}$ Pa·m$^3$/sec. The sample No. 188 had the Cu content of 0.09 mass % in the metal joint material, and the brazing material was cracked under the thermal shock cycle, with the He leak rate as large as $1\times10^{-7}$ Pa·m$^3$/sec.

The sample No. 189 had the Cu content of 6.00 mass % in the metal joint material, and the brazing material was cracked under the thermal shock cycle, with the He leak rate as large as $1.2\times10^{-8}$ Pa·m$^3$/sec. The sample No. 190 had the Mg content of 0.09 mass % in the metal joint material, and the brazing material was cracked under the thermal shock cycle, with the He leak rate as large as $1\times10^{-7}$ Pa·m$^3$/sec. The sample No. 191 had the Mg content of 6.00 mass % in the metal joint material, and the brazing material was cracked under the thermal shock cycle, with the He leak rate as large as $1\times10^{-8}$ Pa·m$^3$/sec.

Ag content of 0.009 mass % in the metal joint material, and the brazing material was cracked under the thermal shock cycle, with the He leak rate as large as $1\times10^{-8}$ Pa·m$^3$/sec. The sample No. 197 had the Ag content of 11.00 mass % in the metal joint material, and the brazing material was cracked under the thermal shock cycle, with the He leak rate as large as $5\times10^{-8}$ Pa·m$^3$/sec.

Meanwhile, it could be seen that the samples No. 181 to 185, within the scope of the present invention, that is, the metal joint material contains 6 to 15 mass % of Si, 0.1 to 5 mass % of Mg or Cu, and the remaining part including a main component of Al and an additive component of 0.01 to 10 mass % of at least one selected out of Ni, Au and Ag, could constitute the excellent wafer holding member with the He leak rate of $3\times10^{-10}$ Pa·m$^3$/sec or below and no crack.

EXAMPLE 6

The AlN (aluminum nitride) sintered body was produced by steps of adding a IIIa group oxide of about 10 mass % in terms of weight into AlN powder, followed by mixing the powder with IPA (isopropyl alcohol) and urethane balls in a ball mill for 48 hours, followed by filtering the resulting AlN slurry with a 200-mesh screen to remove leavings of the urethane balls or a wall of the ball mill, followed by drying the slurry at 120 degree-C. for 24 hours in an explosion-proof dryer to obtain a uniform AlN mixed powder, followed by mixing the mixed powder with an acrylic binder and a solvent, followed by forming a AlN slip and taping using a doctor blade method.

Then, the above-mentioned steps were followed by laminating a plurality of sheet of the resulting AlN tape, followed by forming an electrode of W (tungsten) on the lamination using a screen printing method, followed by applying a desired contact liquid onto an unpatterned tape, followed by laminating a plurality of sheet of the tape and press-molding them.

The resulting mixed molded body of AlN with the tungsten electrode was degreased at 500 degree-C. for about 5 hours in a flow of non-oxidizing gas, and sintered at 1,900 degree-C. for about 5 hours in a non-oxidizing atmosphere, resulting the AlN sintered body.

The resulting AlN sintered body was machined so as to obtain the wafer holding portion with a desired shape and a desired thickness of the insulating layer on the placing surface and the electrode. Then, a desired shape of gas groove was formed on the placing surface using sandblast or the like.

Then, a metal layer was formed on a principal plane opposite to the placing surface of the wafer holding portion using plating.

The composite plate containing SiC, aluminum and silicon, on which another metal layer was formed in such a manner as described above, was joined to the above-mentioned wafer holding portion via a metal joint material, such as aluminum or indium brazing material.

Further, the above-mentioned joint was preformed in a vacuum chamber of about $1 \times 10^{-6}$ Pa, either at 550 to 600 degree-C. in case of using aluminum brazing material, or at 180 to 200 degree-C. in case of using indium brazing material, with a loading weight of 98 kPa.

As to the thickness of the metal layer on the surface of the composite plate, after cutting the joint body of the wafer holding member and the composite plate, the joint portion was imaged using a SEM (scanning electron microscope) photograph with a magnification of 1,000, followed by measuring the thicknesses of the metal layer and the metal joint material, the ratio of which was calculated.

Each thickness of the metal layer and the metal joint material was an average value of two thicknesses of each layer measured in the center and the periphery.

The resulting wafer holding member was examined using ultrasonography to confirm that neither crack nor peeling occurred in the joint plane. Next, a thermal shock test of keeping it in an air chamber of −40 degree-C. for 1 hour and in an atmosphere of 150 degree-C. for 1 hour was performed 1,000 cycles. Then, the wafer holding member was examined once again using ultrasonography to confirm whether or not crack occurred. The result is shown in Table 6.

TABLE 6

| Sample No. | Contents of metal layer | Contents of metal joint material | Thickness of metal joint material: t (μm) | Thickness of metal layer on side of composite plate: tm (μm) | Ratio of tm to t (tm/t) | Thickness of metal layer on side of plate ceramic body: tc (μm) | Ratio of tc to t (tc/t) | Ultrasonor before thermal shock test | Ultrasonor after 1,000 cycles of thermal shock test |
|---|---|---|---|---|---|---|---|---|---|
| 201 | Ni—Au | In brazing | 100 | 1 | 0.010 | 5 | 0.050 | no crack | no crack |
| 202 | Zn—Al | Al brazing | 100 | 5 | 0.050 | 10 | 0.100 | no crack | no crack |
| 203 | Al | In brazing | 100 | 10 | 0.100 | 1 | 0.010 | no crack | no crack |
| 204 | Ni | Al brazing | 100 | 20 | 0.200 | 1 | 0.010 | no crack | no crack |
| 205 | Au | In brazing | 100 | 30 | 0.300 | 5 | 0.050 | no crack | no crack |
| 206 | Cu | Al brazing | 100 | 40 | 0.400 | 40 | 0.400 | no crack | no crack |
| 207 | Ni | In brazing | 50 | 45 | 0.900 | 50 | 1.000 | no crack | no crack |
| 208 | Ni—Au | Al brazing | 200 | 200 | 1.000 | 10 | 0.050 | no crack | no crack |
| *209 | Ni—Au | Al brazing | 100 | 0.8 | 0.008 | 5 | 0.050 | no crack | cracking |
| *210 | Ni—Au | Al brazing | 100 | 101 | 1.010 | 15 | 0.150 | no crack | cracking |

Note:
Samples marked with "*" are outside the scope of the invention.

The samples No. 201 to 208 according to the present invention, that is, the ratio tm/t of the thickness tm of the metal layer on the side of the composite plate to the thickness t of the metal joint material is in a range of 0.01 to 1, had excellent characteristics because no crack occurred after 1,000 cycles of the thermal shock cycle of −40 to 150 degree-C.

On the other hand, the samples No. 209 and 210 with ratios of 0.008 and 1.010, respectively, were outside the scope of the invention, in which crack occurred in the metal joint material.

Further, the samples with the ratio tc/t of the thickness tc of the metal layer on the side of the plate ceramic body to the thickness t of the metal joint material was in a range of 0.01 to 1, had preferable characteristics.

EXAMPLE 7

The wafer holding member with various metal layers was produced in a manner similar to Example 6, and then evaluated after 10,000 cycles of the thermal shock cycle of −40 to 150 degree-C. The result is shown in Table 7.

TABLE 7

| Sample No. | Contents of metal layer | Contents of metal joint material | Thickness of metal joint material: t (μm) | Thickness of metal layer on side of composite plate: tm (μm) | Ratio of tm to t (tm/t) | Thickness of metal layer on side of plate ceramic body: tc (μm) | Ratio of tc to t (tc/t) | Ultrasonor before thermal shock test | Ultrasonor after 10,000 cycles of thermal shock test |
|---|---|---|---|---|---|---|---|---|---|
| 221 | Ni—Au | Al brazing | 100 | 1 | 0.010 | 5 | 0.050 | no crack | no crack |
| 222 | Ni—Au | Al brazing | 100 | 5 | 0.050 | 10 | 0.100 | no crack | no crack |
| 223 | Al | Al brazing | 100 | 10 | 0.100 | 1 | 0.010 | no crack | no crack |
| 224 | Ni | Al brazing | 100 | 20 | 0.200 | 1 | 0.010 | no crack | no crack |
| 225 | Au | Al brazing | 100 | 30 | 0.300 | 5 | 0.050 | no crack | no crack |
| 226 | Ag—Cu | Al brazing | 100 | 40 | 0.400 | 40 | 0.400 | no crack | no crack |
| 227 | Ni | Al brazing | 50 | 45 | 0.900 | 50 | 1.000 | no crack | no crack |
| 228 | Ni—Au | Al brazing | 200 | 200 | 1.000 | 10 | 0.050 | no crack | no crack |
| 229 | Zn—Al | Al brazing | 100 | 5 | 0.050 | 5 | 0.050 | no crack | cracking |
| 230 | Zn—Al | Al brazing | 100 | 10 | 0.100 | 10 | 0.100 | no crack | cracking |
| 231 | Pb | Al brazing | 100 | 15 | 0.150 | 15 | 0.150 | no crack | cracking |
| 232 | Pb | Al brazing | 100 | 20 | 0.200 | 20 | 0.200 | no crack | cracking |

The samples No. 221 to 228, in which the metal layer on the surface of the composite plate 4 had a main component of one or two or more selected out of aluminum, gold, silver, copper and nickel, had more excellent characteristics because no crack occurred after 10,000 cycles of the thermal shock cycle of −40 to 150 degree-C.

EXAMPLE 8

The wafer holding member with various areas of the composite plate 4 was produced in a manner similar to Example 6, and then the residual attracting force was repeatedly evaluated by applying a voltage of 1 kV to the electrodes via the feeding terminals to attract a Si wafer of 25 mm square, followed by tuning off the applied voltage and mechanically pulling the wafer off three seconds later while measuring the residual attracting force. The initial residual attracting force was represented by an average value of a series of the first to tenth residual attracting forces, which were repeatedly measured. The emerging point of the residual attracting force was represented by the repetition number of times when the residual attracting force exceeded the double of the average value of the first to tenth residual attracting forces. The result is shown in Table 8.

TABLE 8

| Sample No. | Projected area of composite plate/ attracting area (%) | Attraction/release number of times when residual attracting force emerging |
|---|---|---|
| 241 | 80 | 10,000 |
| 242 | 90 | 50,000 |
| 243 | 99 | 90,000 |
| 244 | 100 | 110,000 |

TABLE 8-continued

| Sample No. | Projected area of composite plate/ attracting area (%) | Attraction/release number of times when residual attracting force emerging |
|---|---|---|
| 245 | 110 | 120,000 |
| 246 | 114 | 150,000 |
| 247 | 115 | 200,000 |
| 248 | 120 | 210,000 |
| 249 | 140 | 220,000 |
| 250 | 145 | 230,000 |
| 251 | 150 | 250,000 |

In case the projected area of composite plate to the placing surface was under 100%, the residual attracting force emerged at below 100,000 of an attraction and release number of times. In a case 100% or more, the residual attracting force emerged at 100,000 times or more. In another case 115% or more, the residual attracting force emerged at 200,000 times or more. Accordingly, the area of the conductive layer with respect to the area of the placing surface was preferably 100% or more, more preferably 115% or more.

EXAMPLE 9

The electrostatic chucks with the placing surface of 300 mm in size and the plate ceramic body having various thickness of 5 to 20 mm were produced in a manner similar to Example 6.

Then, a through-hole was provided in the center of the plate ceramic body, and grooves with a depth of 5 to 1 mm and a width of 2 mm were formed on the placing surface. The samples No. 261 to 265 and 269 to 272 had eight grooves radial from the center and three circular grooves located with a pitch of 45 mm from the center. The samples No. 266 to 268 had eight radial grooves, whose radial length from the center were ¼, ⅓ and ½ of the radius of the placing surface, respectively.

The sample No. 273, for a comparative example, had a spiral groove with a pitch of 35 mm from the center on the plate ceramic body.

The residual attracting force was measured in vacuum by applying a voltage of 500 kV for 2 minutes with a Si wafer of 1 inch square mounted on the attracting surface, followed by tuning off the voltage and mechanically pulling the wafer off three seconds later while measuring a force required for pulling using a load cell. The residual attracting force per unit area was represented by the measured value divided by the area of the attracting surface of 1 inch square.

Further, the temperature of the wafer attracted onto the placing surface was measured while the composite plate was water-cooled, and the temperature change of the wafer was also measured 10 minutes later while being heated by a lamp above.

The result is shown in Table 9.

TABLE 9

| Sample No. | Thickness of plate ceramic body (mm) | Depth of groove (μm) | Ratio of length L of radial groove to radius d of placing surface (L/d) | Residual attracting force (kPa) | Temperature change 10 minutes later while lamp-heating (C.) |
|---|---|---|---|---|---|
| 261 | 5 | 50 | 1 | 0.20 | 17 |
| 262 | 8 | 50 | 1 | 0.20 | 17 |
| 263 | 10 | 5 | 1 | 0.25 | 50 |
| 264 | 10 | 10 | 1 | 0.30 | 24 |
| 265 | 10 | 100 | 1 | 0.30 | 15 |
| 266 | 10 | 200 | 1/4 | 0.90 | 13 |
| 267 | 10 | 200 | 1/3 | 0.05 | 13 |
| 268 | 10 | 200 | 1/2 | 0.10 | 13 |
| 269 | 10 | 300 | 1 | 0.20 | 11 |
| 270 | 10 | 1000 | 1 | 1.30 | 8 |
| 271 | 15 | 500 | 1 | 0.40 | 10 |
| 272 | 20 | 500 | 1 | 3.00 | 10 |
| 273 | 10 | 200 | 0 | 1.50 | 15 |

The sample No. 272, having the plate ceramic body with a thickness of 20 mm, had the residual attracting force as slightly large as 3 kPa.

Meanwhile, the samples No. 261 to 271 and 273, having the plate ceramic body with a thickness of 15 mm or below, had an excellent characteristics of the residual attracting force as small as 1.5 kPa or below.

Further, the samples No. 261, 262, 264 to 269, 271 and 272 according to the present invention, having the groove depth of 10 to 500 μm, preferably had the residual attracting force as small as 0.9 kPa or below, and the temperature change as small as 24 degree-C. or below.

Meanwhile, the sample No. 263, with the groove depth of 5 μm, had the temperature change of 50 degree-C. on the placing surface, being unsuitable for the wafer holding member.

The sample No. 270, with the groove depth of 1,000 μm, had the residual attracting force as large as 1.3 kPa.

Further, the samples No. 261, 262, 265, 267 to 269, with the groove depth of 50 to 300 μm, preferably had the residual attracting force still as small as 0.3 kPa or below, and the temperature change on the placing surface as small as 17 degree-C. or below.

The sample No. 266, with the length of the radial groove being as small as ¼ of the radius of the placing surface, had the residual attracting force still as slightly large as 0.9 kPa.

Meanwhile, the samples No. 261 to 269, with the long radial grooves, preferably had the residual attracting force as small as 0.9 kPa or below. The samples No. 261 to 265 and 267 to 272, with the length of the radial groove being ⅓ or more of the length of the placing surface, more preferably had the residual attracting force as small as 0.3 kPa or below.

Although the present invention has been fully described in connection with the preferred embodiments thereof and the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A composite material being composed of SiC, $SiO_2$, at least one selected from the group consisting of Al and Si, wherein the composite material is made by impregnating a fusion solidified body, which is composed of SiC and at least one selected from the group consisting of Al and Si, wherein alkyl silicate is used to fill pores of the body, and then the body is dried to retain $SiO_2$ inside the body so that the pores of the fusion solidified body are sealed, with He leak rate of $1.3 \times 10^{-10}$ Pa·m³/sec or below, wherein the He leak rate is measured by a method comprising:

attaching the surface of the composite material with a metal pipe integrated with an O-ring having an internal diameter of 30 mm, followed by vacuuming the inside room of the pipe, followed by putting the metal pipe and the composite material in a vinyl bag or a desired shape of casing, followed by filling it with a He gas to introduce the He gas into the inside room of the metal pipe thorough all of leaking locations, and followed by continuously supplying the He gas to confirm a drop of vacuum.

2. The composite material of claim 1, containing 69 to 79 mass % of SiC, 10.6 to 20.6 mass % of Al, 5.4 to 15.4 mass % of Si, and 0.01 to 5 mass % of $SiO_2$.

3. The composite material of claim 1, containing 71.5 to 76.5 mass % of SiC, 13.1 to 18.1 mass % of Al, 7.9 to 12.9 mass % of Si, and 0.05 to 2 mass % of $SiO_2$.

4. A wafer holding member, comprising:

a wafer holding portion having a plate base, which has two principal planes opposing one another, wherein one principal plane of which serves as a placing surface for mounting a wafer, and an electrode is provided either on the other principal plane or inside of the plate base; and a plate formed of the composite material according to claim 1;

wherein the coefficient of thermal expansion of the plate is 0.8 to 1.2 times as large as the coefficient of thermal expansion of the plate base, and the plate base and the plate are joined to each other using a metal joint material.

5. The wafer holding member of claim 4, wherein the metal joint material contains 6 to 15 mass % of Si, 0.1 to 5 mass % of Mg or Cu, and the remaining 80 to 93.9 mass % being comprised of Al and an additive component of 0.01 to 10 mass % of at least one selected from the group consisting of Ni, Au and Ag.

6. A method for manufacturing the composite material according to claim 1, including:
    a step for impregnating a fusion solidified body, which is composed of SiC and at least one selected from the group consisting of Al and Si, with alkyl silicate; and
    a subsequent step for drying the body.

7. A wafer holding member, comprising:
    a wafer holding portion having a plate ceramic body, which has two principal planes opposing one another, wherein one principal plane of which serves as a placing surface for mounting a wafer, and an electrode is provided either on the other principal plane or inside of the plate ceramic body;
    a composite consisting of the composite material of claim 1;
    a first metal layer provided on a face opposite to the placing surface of the wafer holding portion; and
    a second metal layer provided on a face of the composite plate;
    wherein the plate ceramic body and the composite plate are joined to each other via a metal joint material between the first and second metal layers, and
    a ratio of the thickness tm of the second metal layer to the thickness t of the metal joint material is in a range of 0.01 to 1.

8. The wafer holding member of claim 7, wherein the second metal layer has a main component of one or two or more selected from the group consisting of aluminum, gold, silver, copper and nickel.

9. The wafer holding member of claim 8, wherein the metal joint material is a brazing material having a main component of aluminum or indium.

10. The wafer holding member of claim 7, wherein the metal joint material is a brazing material having a main component of aluminum or indium.

11. The wafer holding member of claim 10, wherein the electrode is an electrode for electrostatic attraction.

12. The wafer holding member of claim 7, wherein the electrode is an electrode for electrostatic attraction.

13. A wafer holding member, comprising:
    a wafer holding portion having a plate base, which has two principal planes opposing one another, wherein one principal plane of which serves as a placing surface for mounting a wafer, and an electrode is provided either on the other principal plane or inside of the plate base; and
    a plate formed of the composite material according to claim 2;
    wherein the coefficient of thermal expansion of the plate is 0.8 to 1.2 times as large as the coefficient of thermal expansion of the plate base, and
    the plate base and the plate are joined to each other using a metal joint material.

14. The wafer holding member of claim 13, wherein the metal joint material contains 6 to 15 mass % of Si, 0.1 to 5 mass % of Mg or Cu, and the remaining 80 to 93.9 mass % being comprised of Al and an additive component of 0.01 to 10 mass % of at least one selected from the group consisting of Ni, Au and Ag.

* * * * *